United States Patent
Paul et al.

(10) Patent No.: US 11,335,704 B2
(45) Date of Patent: May 17, 2022

(54) LOW PARASITIC CAPACITANCE RF TRANSISTORS

(71) Applicant: pSemi Corporation, San Diego, CA (US)

(72) Inventors: Abhijeet Paul, Poway, CA (US); Simon Edward Willard, Irvine, CA (US); Alain Duvallet, San Diego, CA (US); Ronald Eugene Reedy, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 28 days.

(21) Appl. No.: 16/922,392

(22) Filed: Jul. 7, 2020

(65) Prior Publication Data

US 2020/0335522 A1 Oct. 22, 2020

Related U.S. Application Data

(62) Division of application No. 16/243,947, filed on Jan. 9, 2019, now abandoned.

(Continued)

(51) Int. Cl.
*H01L 27/12* (2006.01)
*H01L 23/528* (2006.01)
*H01L 23/367* (2006.01)

(52) U.S. Cl.
CPC ........ *H01L 27/1203* (2013.01); *H01L 23/367* (2013.01); *H01L 23/528* (2013.01)

(58) Field of Classification Search
CPC . H01L 27/1203; H01L 23/528; H01L 23/367; H01L 23/481
See application file for complete search history.

(56) References Cited

U.S. PATENT DOCUMENTS 5,633,182 A    5/1997   Miyawaki et al.
5,739,579 A *   4/1998   Chiang ............ H01L 21/76801
                                                            257/635

(Continued)

FOREIGN PATENT DOCUMENTS

EP       1453093      9/2004
EP       2814053     12/2014

(Continued)

OTHER PUBLICATIONS

Wirner, Christoph, International Preliminary Report on Patentability received from the EPO dated Oct. 30, 2020 for appln. No. PCT/US2019/043994, 26 pgs.

(Continued)

*Primary Examiner* — Yasser A Abdelaziez
(74) *Attorney, Agent, or Firm* — Jaquez Land Greenhaus & McFarland LLP; John Land, Esq.

(57) ABSTRACT

Structures and fabrication methods for transistors having low parasitic capacitance, the transistors including an insulating low dielectric constant first or second handle wafer. In one embodiment, a Single Layer Transfer technique is used to position an insulating LDC handle wafer proximate the metal interconnect layers of an SOI transistor/metal layer stack in lieu of the silicon substrate of conventional designs. In another embodiment, a Double Layer Transfer technique is used to replace the silicon substrate of prior art structures with an insulating LDC substrate. In some embodiments, the insulating LDC handle wafer includes at least one air cavity, which reduces the effective dielectric constant of material surrounding an RF FET. An insulating LDC handle wafer reduces insertion loss and non-linearity, increases isolation, provides for more ideal voltage division of stacked transistors, enables a higher Q factor due to lower coupling losses, and otherwise mitigates various parasitic effects.

11 Claims, 14 Drawing Sheets

Low Dielectric Constant SLT SOI Transistor

Related U.S. Application Data

(60) Provisional application No. 62/712,845, filed on Jul. 31, 2018.

(56) References Cited

U.S. PATENT DOCUMENTS

| | | | |
|---|---|---|---|
| 6,365,465 | B1 | 4/2002 | Chan et al. |
| 6,580,132 | B1 | 6/2003 | Chan et al. |
| 7,180,019 | B1 | 2/2007 | Chiou et al. |
| 9,385,083 | B1 | 7/2016 | Herrault |
| 9,755,029 | B1 | 9/2017 | Goktepeli |
| 9,837,412 | B2 | 12/2017 | Tasbas et al. |
| 9,960,098 | B2 | 5/2018 | Olson |
| 10,573,674 | B2 | 2/2020 | Paul et al. |
| 10,580,903 | B2 | 3/2020 | Kamada et al. |
| 10,658,386 | B2 | 5/2020 | Paul et al. |
| 2005/0037582 | A1 | 2/2005 | Dennard et al. |
| 2005/0242884 | A1 | 11/2005 | Anand |
| 2006/0006496 | A1 | 1/2006 | Harris et al. |
| 2006/0012006 | A1 | 1/2006 | Tung et al. |
| 2008/0020488 | A1 | 1/2008 | Clevenger et al. |
| 2008/0079037 | A1 | 4/2008 | Zhu et al. |
| 2009/0010056 | A1* | 1/2009 | Kuo .................. G11C 16/0408 365/184 |
| 2010/0155932 | A1 | 6/2010 | Gambino et al. |
| 2013/0154088 | A1 | 6/2013 | Cable et al. |
| 2013/0270678 | A1 | 10/2013 | Rankin et al. |
| 2014/0264468 | A1 | 9/2014 | Cheng et al. |
| 2014/0342529 | A1 | 11/2014 | Goktepeli et al. |
| 2015/0255368 | A1 | 9/2015 | Costa |
| 2016/0027665 | A1* | 1/2016 | Li ..................... H01L 21/76898 257/531 |
| 2016/0141228 | A1 | 5/2016 | Leobandung |
| 2016/0336279 | A1* | 11/2016 | Mason ................ H01L 23/5283 |
| 2016/0336344 | A1 | 11/2016 | Mason et al. |
| 2016/0379943 | A1 | 12/2016 | Mason et al. |
| 2017/0033135 | A1* | 2/2017 | Whitefield ............. H01L 23/15 |
| 2017/0084531 | A1 | 3/2017 | Gu et al. |
| 2017/0271200 | A1 | 9/2017 | Costa |
| 2017/0373026 | A1 | 12/2017 | Goktepeli |
| 2018/0158405 | A1 | 6/2018 | Agostinelli et al. |
| 2019/0288006 | A1* | 9/2019 | Paul ........................ H01L 28/40 |
| 2019/0288119 | A1 | 9/2019 | Yamada et al. |
| 2020/0027898 | A1 | 1/2020 | Paul et al. |
| 2020/0027907 | A1 | 1/2020 | Paul et al. |
| 2020/0027908 | A1 | 1/2020 | Paul et al. |
| 2020/0043946 | A1 | 2/2020 | Paul et al. |

FOREIGN PATENT DOCUMENTS

| | | |
|---|---|---|
| EP | 2996143 | 3/2016 |
| WO | 2007120697 | 10/2007 |
| WO | 2016183146 | 11/2016 |
| WO | 2020018471 | 1/2020 |
| WO | 2020028281 | 2/2020 |

OTHER PUBLICATIONS

Yamada, et al., "Semiconductor-on-Insulator Transistor with Improved Breakdown Characteristics", patent application filed in the UPSTO on Mar. 13, 2019, U.S. Appl. No. 15/920,321, 45 pgs.

Mazumder, Didarul A., Office Action received from the USPTO dated Feb. 11, 2019 for U.S. Appl. No. 15/920,321, 20 pgs.

Englekirk, et al., "Managed Substrate Effects for Stabilized SOI FETS", U.S. Patent Application filed in the USPTO on May 19, 2017, U.S. Appl. No. 15/600,588, 62 pgs.

Celler, et al., "Frontiers of Silicon-on-Insulator", Journal of Applied Physics, vol. 93, No. 9, May 1, 2003, pp. 4955-4978 (25 pgs).

Le, Thao P., Office Action received from the USPTO dated Mar. 22, 2019 for U.S. Appl. No. 16/040,390, 11 pgs.

PSemi Corporation, Preliminary Amendment filed in the USPTO dated Jun. 12, 2018 for U.S. Appl. No. 15/920,321, 5 pgs.

PSemi Corporation, Response filed in the USPTO dated Feb. 22, 2019 for U.S. Appl. No. 15/920,321, 8 pgs.

Paul, et al., "Thermal Extraction of Single Layer Transfer Integrated Circuits", patent application filed in the USPTO on Jul. 19, 2018, U.S. Appl. No. 16/040,295, 44 pgs.

Paul, et al., "SLT Integrated Circuit Capacitor Structure and Methods", application filed in the USPTO on Jul. 19, 2018, U.S. Appl. No. 16/040,390, 43 pgs.

Abdelaziez, Yasser A., Office Action received from the USPTO dated Dec. 20, 2019 for U.S. Appl. No. 16/243,947, 8 pgs.

Abdelaziez, Yasser A., Office Action received from the USPTO dated Mar. 9, 2020 for U.S. Appl. No. 16/243,947, 27 pgs.

Abdelaziez, Yasser A., Notice of Non-Compliant Amendment received from the USPTO dated Jun. 2, 2020 for U.S. Appl. No. 16/243,947, 27 pgs.

Wirner, Christoph, International Search Report and Written Opinion received from the EPO dated Oct. 31, 2019 for appln. No. PCT/US2019/043994, 16 pgs.

Mazumder, Didarul A., Final Office Action received from the USPTO dated Jun. 5, 2019 for U.S. Appl. No. 15/920,321, 31 pgs.

Mazumder, Didarul A., Office Action received from the USPTO dated Oct. 18, 2019 for U.S. Appl. No. 15/920,321, 20 pgs.

Mazumder, Didarul A., Notice of Allowance received from the USPTO dated Nov. 20, 2019 for U.S. Appl. No. 15/920,321, 13 pgs.

Huynn, Andy, Office Action received from the USPTO dated Sep. 9, 2019 for U.S. Appl. No. 16/040,295, 5 pgs.

Huynn, Andy, Office Action received from the USPTO dated Oct. 25, 2019 for U.S. Appl. No. 16/040,295, 41 pgs.

Le, Thao P., Notice of Allowance received from the USPTO dated Jun. 5, 2019 for U.S. Appl. No. 16/040,390, 7 pgs.

Le, Thao P., Notice of Allowance received from the USPTO dated Aug. 20, 2019 for U.S. Appl. No. 16/040,390, 14 pgs.

Le, Thao P., Notice of Allowance received from the USPTO dated Dec. 18, 2019 for U.S. Appl. No. 16/040,390, 17 pgs.

Le, Thao P., Notice of Allowance received from the USPTO dated Jan. 31, 2020 for U.S. Appl. No. 16/040,411, 23 pgs.

Huynh, Andy, Notice of Allowance received from the USPTO dated Apr. 3, 2020 for U.S. Appl. No. 16/040,295, 30 pgs.

PSEMI Corporation, Preliminary Amendment filed in the USPTO on Mar. 14, 2019 for U.S. Appl. No. 16/243,947, 6 pgs.

PSEMI Corporation, Response filed in the USPTO on Feb. 18, 2020 for U.S. Appl. No. 16/243,947, 7 pgs.

Wirner, Christoph, Written Opinion received from the EPO dated Jul. 14, 2020 for appln. No. PCT/US2019/043994, 9 pgs.

Sun, Haw Lee, International Preliminary Report on Patentability received from the WIPO dated Sep. 24, 2020 for appln. No. PCT/US2019/021698, 13 pgs.

Hoffmann, Niel, International Search Report and Written Opinion received from the EPO dated Oct. 8, 2019 for appln. No. PCT/US2019/021698, 18 pgs.

\* cited by examiner

Conventional SOI Transistor
(Prior Art)

Conventional SLT SOI Transistor
(Prior Art)

SLT SOI Transistor with RDL
(Related Art)

SOI Transistor Attached to PCB
(Prior Art)

Low Dielectric Constant SLT SOI Transistor

Low Dielectric Constant SLT SOI Transistor with Air Cavity

Low Dielectric Constant SLT SOI Transistor with Dual Air Cavities

Low Dielectric Constant SOI transistor on DLT Handle Wafer

LOW PARASITIC CAPACITANCE RF TRANSISTORS

CROSS-REFERENCE TO RELATED APPLICATIONS—CLAIM OF PRIORITY

The present application is a divisional of, and claims the benefit of priority under 35 USC § 120 of, commonly assigned and co-pending prior U.S. application Ser. No. 16/243,947, filed Jan. 9, 2019, entitled "Low Parasitic Capacitance RF Transistors", the disclosure of which is incorporated herein by reference in its entirety. Application Ser. No. 16/243,947 claims priority to U.S. provisional Patent Application No. 62/712,845, filed on Jul. 31, 2018, entitled "Low Parasitic Capacitance RF Transistors", which is herein incorporated by reference in its entirety.

This invention may be related to the following patent applications, all assigned to the assignee of the present invention, the contents of all of which are incorporated by reference:

U.S. patent application Ser. No. 15/920,321, filed Mar. 13, 2018, entitled "Semiconductor-on-Insulator Transistor with Improved Breakdown Characteristics", now U.S. Pat. No. 10,580,903, issued Mar. 3, 2020;

U.S. patent application Ser. No. 16/040,295, filed Jul. 19, 2018, entitled "Thermal Extraction of Single Layer Transfer Integrated Circuits", now U.S. Pat. No. 10,658,386 issued May 19, 2020;

U.S. patent application Ser. No. 16/040,390, filed Jul. 19, 2018, entitled "SLT Integrated Circuit Capacitor Structure and Methods", now U.S. Pat. No. 10,573,674 issued Feb. 25, 2020.

BACKGROUND

(1) Technical Field

This invention relates to electronic integrated circuits, and more particularly to electronic integrated circuits having transistors fabricated with semiconductor-on-insulator technology.

(2) Background

Virtually all modern electronic products—including laptop computers, mobile telephones, and electric cars—utilize complementary metal oxide semiconductor (CMOS) field-effect transistor (FET) integrated circuits (ICs) as switching devices, particularly for switching of radio frequency (RF) signals. In many cases, CMOS ICs are fabricated using a semiconductor-on-insulator process, such as silicon-on-insulator (SOI) or germanium-on-insulator. SOI transistors in which the electrical insulator is aluminum oxide (i.e., sapphire) are also called silicon-on-sapphire or "SOS" devices. CMOS SOI FET circuitry generally comprises an n-type SOI FET and a p-type SOI FET.

FIG. 1 is a cross-sectional view of a prior art n-type SOI FET 100 fabricated on a buried oxide (BOX) layer 102, generally silicon dioxide, $SiO_2$, formed on a silicon substrate 104. The FET structure includes a doped source S spaced from a doped drain D by a body of opposite doping (for so-called enhancement-mode FETs), in and/or on a silicon active layer 106 on the BOX layer 102. A conductive Gate (typically metal or polysilicon), spaced by an insulator 108 (e.g., an oxide), defines the Body. As is known in the art, a silicide layer (not shown) is generally formed over the source, drain, and gate regions, and one or more metal interconnect layers (not shown) and one or more insulating dielectric material (ILD) layers 110 (e.g., an oxide or nitride), and a passivation layer (not shown in FIG. 1, but see FIG. 4) are typically formed over the FET structure to provide circuit connections, insulation, and environmental protection. The various layers of the FET structure may be formed by implantation, diffusion, and/or deposition, in known fashion. As is known in the art, p-type SOI FETs have a similar structure, but with different dopants.

Fabrication of the SOI FET 100 structure avoids certain parasitic effects typical of bulk silicon (Si) CMOS ICs. However, the BOX layer 102 introduces some problems of its own, such as parasitic capacitive coupling to the substrate, creation of a so-called "back channel" transistor 112, a thermal barrier to heat flow, and a voltage breakdown path to the substrate. Capacitive coupling to/from the substrate can cause numerous side effects for analog and digital transistors, such as increased leakage current, lower breakdown voltage, crosstalk, increased junction temperature, and linearity degradation, all as compared to a bulk silicon transistor or to a SOI transistor with a truly insulating substrate, such as SOS. For RF transistors, additional side effects, especially for RF switches, are insertion loss, isolation, non-ideal voltage division of stacked transistors, and distortion (also known as non-linearity).

As described in U.S. patent application Ser. No. 15/920,321, referenced above, it is possible to mitigate some of the parasitic side effects using a fabrication technique called Single Layer Transfer, or SLT. The SLT process flips an entire SOI transistor structure upside down with mechanical support provided by a so-called handle wafer, typically of silicon. FIG. 2 is a cross-sectional view of a prior art SLT transistor. Essentially, the "top" of the FET structure of FIG. 1 is bonded to a handle wafer 202 and the original substrate 104 is removed (silicide layer and metal interconnect layers not shown for clarity). A second ILD layer 204 may be formed on the newly exposed BOX layer for insulation and environmental protection.

FIG. 3 is a more detailed cross-sectional view of an SLT transistor 300 having a source, a drain, and gate (all within the dotted oval 302) with internal metal interconnect layers 304 plus a redistribution layer (RDL) 306. More specifically, referring to FIG. 3, the RDL 306 comprises a conductive (e.g., metal) layer configured to control capacitive back channel parasitic effects using a conductive aligned supplemental ("CAS") gate 306a formed over the added ILD layer 204, as further described in U.S. patent application Ser. No. 15/920,321. In the illustrated example, the internal metal interconnect layers 304 (example layers M1-M5 are shown, interspersed by layers of insulating dielectric material) are generally formed within the ILD layers 110, which insulates most of the active layer 106 from the first (M1) metal interconnect layer, except where holes or vias for electrical contacts to the gate, source, and drain are formed (omitted for clarity). Note that the ILD layers 110, while shown as a unitary element in FIG. 3 (and the other figures), is generally built up as multiple layers during the formation of the metal interconnect layers 304. Thus, the metal interconnect layers 304 are effectively embedded in the ILD layers 110, with electrical connections made between metal interconnect layers 304 by, for example, conductive vias formed by etching and filling holes in the ILD layers 110.

The basic transistor structure, including internal metal interconnect layers 304, is generally formed inside a CMOS fabrication facility while the RDL 306 is typically formed after the SLT "flipping" process step. Thus, the RDL 306 is added after wafers have completed most or all of the CMOS fabrication process.

While the RDL 306 and CAS gate 306a shown in FIG. 3 can control parasitic back channel effects, in regions proximate the transistor active region (which is within the dotted oval 302), the RDL 306 is spaced from the transistor active region by a relatively thick insulating layer 204 (typically an insulating dielectric material like $SiO_2$) and, in some cases, by a passivation layer 206, both of which are poor thermal conductors. Since transistors create heat that must be removed, removing heat from the SLT transistor can be difficult, leading to numerous degradations such as transistor performance and reliability. Some structures and methods for mitigating this heat flow problem are taught in U.S. patent application Ser. No. 16/040,295, referenced above.

An additional issue with the structure shown in FIG. 3 is that the metal interconnect layers 304 (particularly the thicker M5 and M4 layers) are in close proximity to the silicon handle wafer 202, which can cause similar or larger parasitic effects as discussed for the structure in FIG. 1.

FIG. 4 is a cross-sectional view of an "inverted" image of one field effect transistor structure 400 (within the dotted oval 302) of a prior art SOI FET IC (with internal metal interconnect layers 304 shown) attached to a printed circuit board (PCB) 402. The illustrated field effect transistor structure 400 includes a passivation layer 408 covering the exposed surface of the ILD layer 110. FIG. 4 depicts the FET structure 400 after flip-chip solder bumping and die attachment to the PCB 402 through terminals comprising solder bumps 404 in contact with conductive vias 406 to at least one metal interconnect layer 304. As can be seen, the silicon substrate 104 is still adjacent the back channel 112 of the SOI transistor, causing the RF parasitic effects discussed above.

Accordingly, in conventional CMOS SOI ICs, either the transistor active region is adjacent to a silicon substrate (as in FIG. 1 and FIG. 4), or is connected to metal interconnect layers which are adjacent to a silicon handle wafer (as in FIG. 3). Either way, the silicon substrate/handle wafer couples to signals carried by the transistor and its interconnected metal layers, inducing insertion loss, non-linearity, reduced isolation, non-ideal voltage division of stacked transistors, and other parasitic effects discussed above.

The prior art structures descried with respect to FIGS. 1-4 all include a silicon substrate/handle wafer on either a top or bottom surface. In either case, various types of coupling to the silicon substrate/handle wafer reduces performance, as described above. It is a main purpose of the present invention to maintain the various benefits of the transistor structures shown in FIGS. 1-4 while eliminating the silicon substrate/handle wafer and its deleterious side effects.

SUMMARY

The present invention encompasses transistor structures, particularly RF MOSFET signal switches, that have low parasitic capacitance, and methods for fabricating such transistor structures. The transistor structures include an insulating low dielectric constant first or second handle wafer.

In one embodiment, a Single Layer Transfer, or SLT, fabrication technique is utilized. For example, an SOI transistor is fabricated in conventional fashion on a silicon substrate (up to a point), then flipped onto a handle wafer comprising an insulating low dielectric constant (LDC) substrate, at which point the original silicon substrate is removed. The entire structure is then flipped back to its original fabrication orientation, meaning the BOX layer and active layer are now on the "bottom" of the stacked structure. Accordingly, the insulating LDC handle wafer is now positioned "above" the metal interconnect layers of the original SOI transistor/metal layer stack in place of the silicon substrate of conventional SLT designs.

In another embodiment, a Double Layer Transfer, or DLT, fabrication technique is utilized. For example, an SOI transistor is fabricated in conventional fashion on a silicon substrate (up to a point), then flipped onto a first handle wafer, at which point the original silicon substrate is removed. The exposed top of the transistor structure is then bonded to a second handle wafer comprising an insulating LDC handle wafer, and the first handle wafer is removed. Accordingly, an insulating LDC substrate has replaced the silicon substrate of prior art structures.

In some embodiments, the insulating LDC handle wafer is selectively etched or ground to create at least one air cavity before bonding to the transistor structure, thereby further reducing the effective dielectric constant of material surrounding an RF FET.

Use of an insulating LDC handle wafer reduces insertion loss and non-linearity, increases isolation, provides for more ideal voltage division of stacked transistors, enables a higher Q factor due to lower coupling losses, and otherwise mitigates the parasitic effects discussed above.

Variant embodiments may include additional structures to mitigate or eliminate thermal conductivity problems.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

Figure 1:
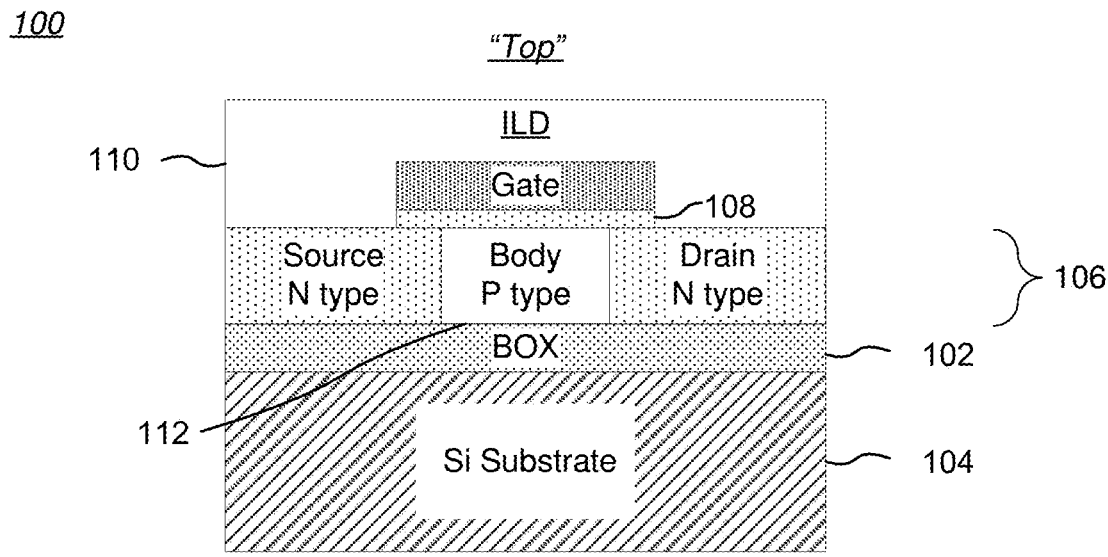
FIG. 1 is a cross-sectional view of a prior art n-type SOI FET fabricated on a buried oxide (BOX) layer, generally silicon dioxide, $SiO_2$, formed on a silicon substrate.
Figure 2:
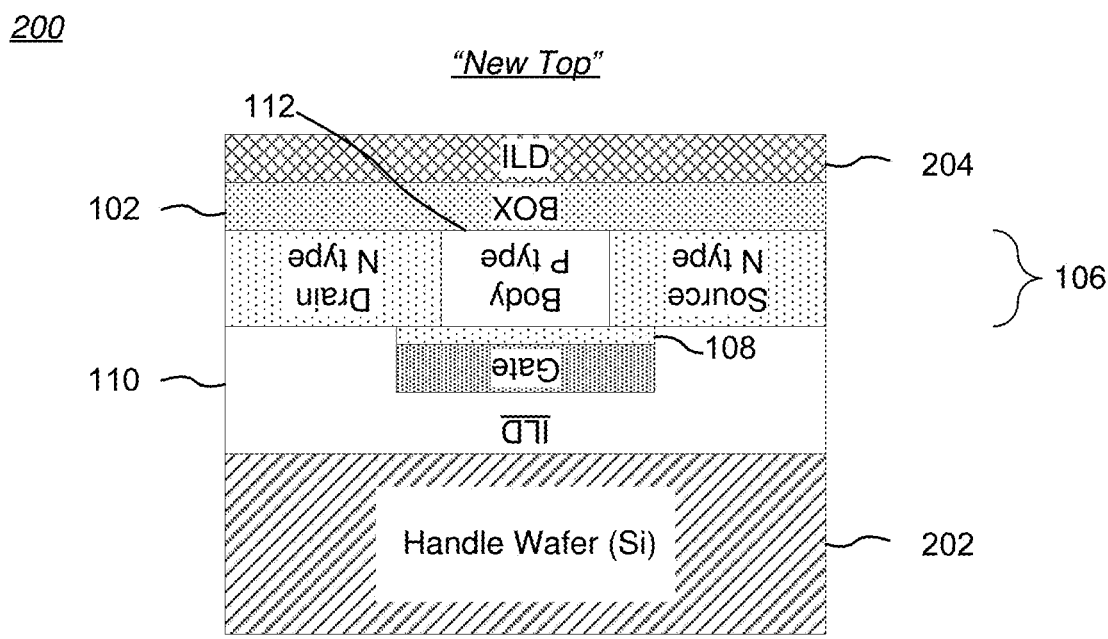
FIG. 2 is a cross-sectional view of a prior art SLT transistor without metal interconnect layers, for clarity.
Figure 3:
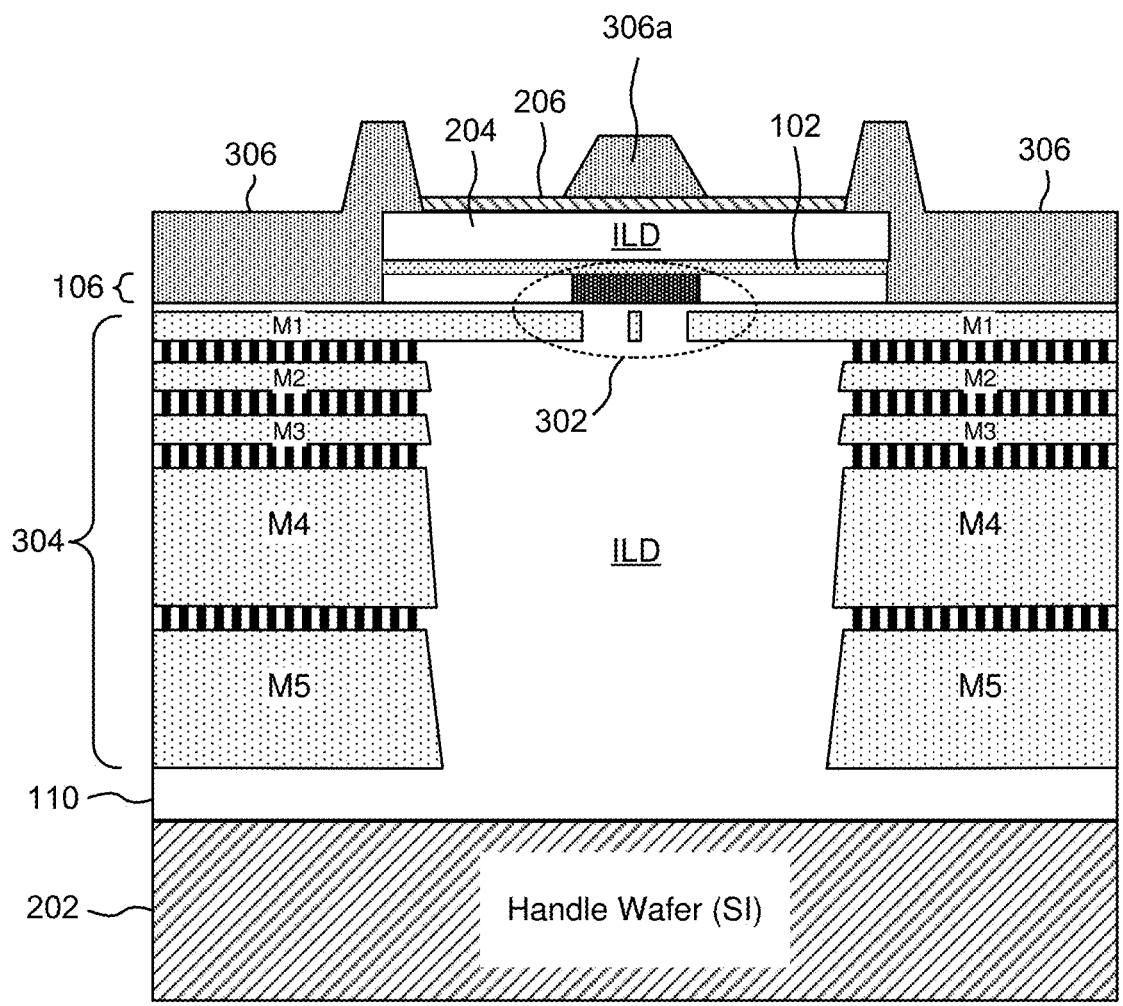
FIG. 3 is a more detailed cross-sectional view of an SLT transistor having a source, a drain, and gate (all within the dotted oval) with internal metal interconnect layers plus a redistribution layer (RDL).

The present invention encompasses transistor structures, particularly RF MOSFET signal switches, that have low parasitic capacitance, and methods for fabricating such transistor structures. The transistor structures include an insulating low dielectric constant first or second handle wafer.

Relative Dimensions and Orientations in the Drawings

With respect to the figures referenced in this disclosure, note that the dimensions for the various elements are not to scale; some dimensions have been greatly exaggerated vertically and/or horizontally for clarity or emphasis. In addition, references to orientations and directions (e.g., "top", "bottom", "above", "below", "lateral", "orthogonal" etc.) are relative to the example drawings, and not necessarily absolute orientations or directions.

Single Layer Transfer Embodiments

Figure 4:
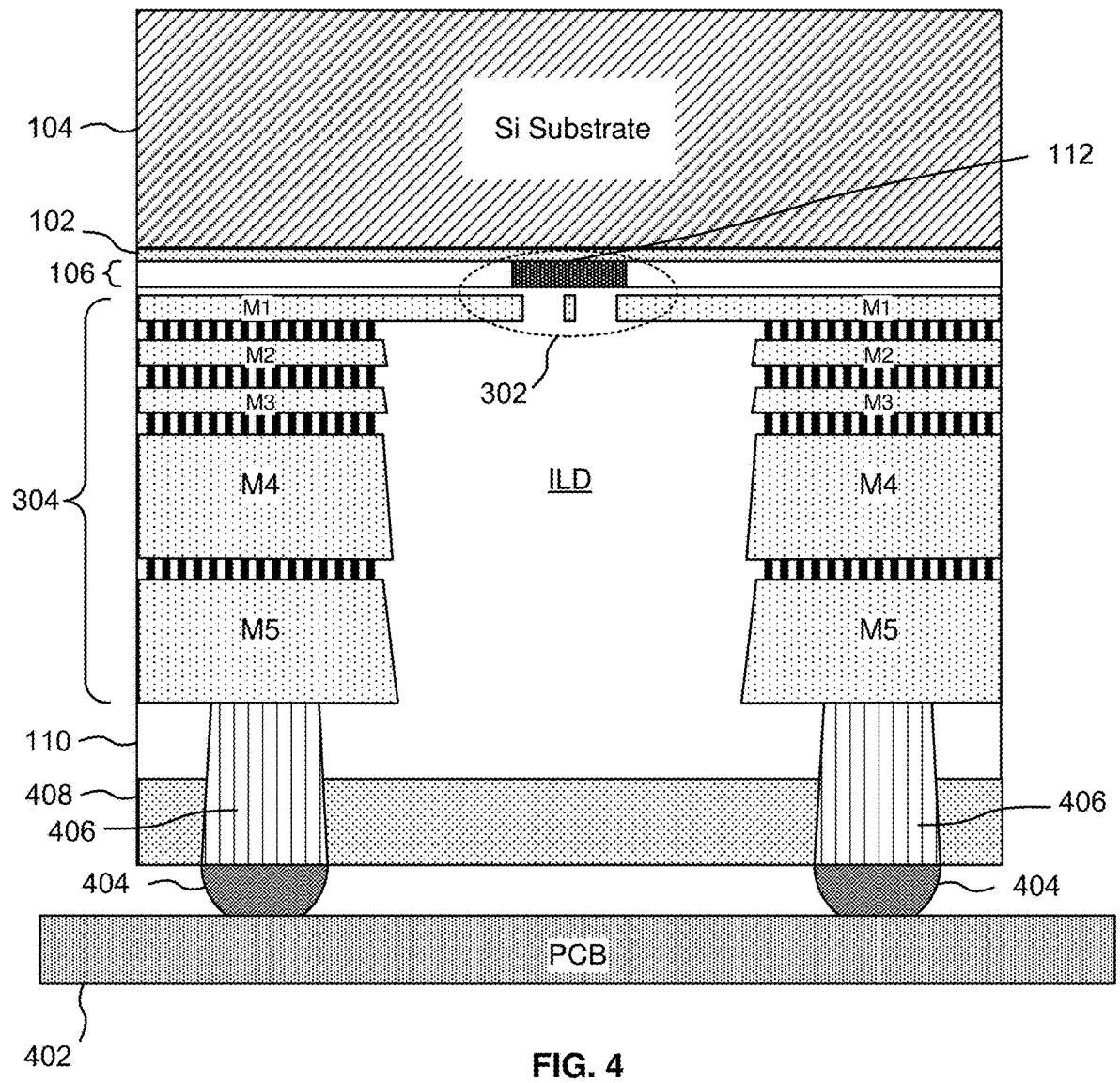
FIG. 4 is a cross-sectional view of an "inverted" image of one field effect transistor structure (within the dotted oval) of a prior art SOI FET IC (with internal metal interconnect layers shown) attached to a printed circuit board (PCB).
Figure 5:
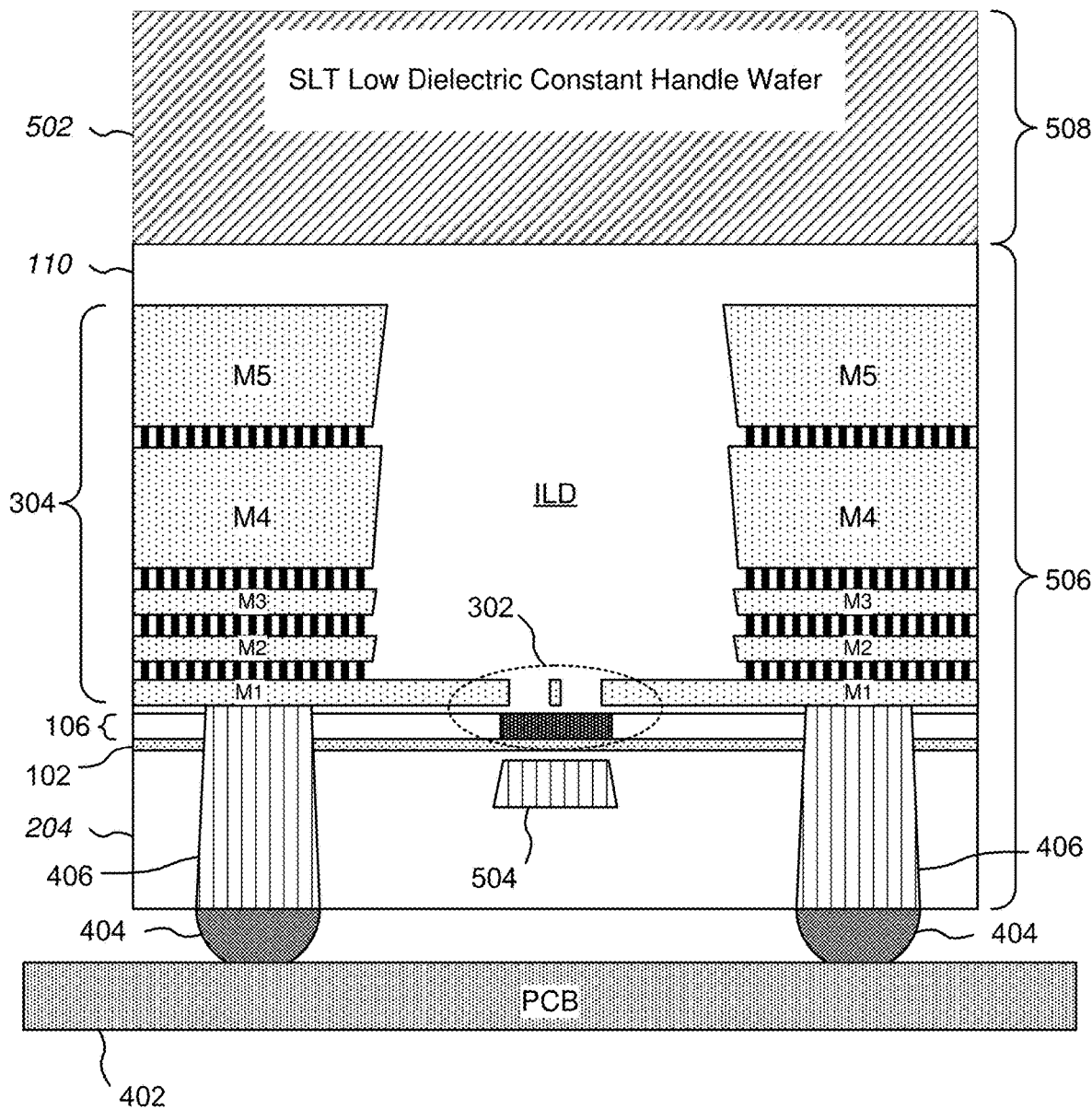
FIG. 5 is a cross-sectional view of a first embodiment of an RF SLT SOI transistor having a source, a drain, and gate (all within the dotted oval) according to the present invention, after attachment to a printed circuit board (PCB).

FIG. 5 is a cross-sectional view of a first embodiment 500 of an RF SLT SOI transistor having a source, a drain, and gate (all within the dotted oval 302) according to the present invention, after attachment to a printed circuit board (PCB). As can be seen, the structure has eliminated the silicon substrate 104 of the prior art (see FIG. 4). More particularly, the SOI transistor is fabricated in conventional fashion on a silicon substrate (up to a point), then flipped onto a handle wafer 502 comprising an insulating low dielectric constant (LDC) substrate, at which point the original silicon substrate is removed. The entire structure is then flipped back to its original fabrication orientation, meaning the BOX layer 102 and active layer 106 are now on the "bottom" of the stacked structure, relative to the depiction of FIG. 5. The insulating LDC handle wafer 502 is now positioned "above" the metal interconnect layers 304 (e.g., M1-M5) of the original SOI transistor/metal layer stack in place of the silicon substrate of conventional SLT designs. Thereafter, additional steps may be performed, such as flip-chip solder bumping (e.g., to connections through the BOX layer 102 and active layer 106 of the transistor structure) and die attachment to a PCB. For example, FIG. 5 depicts the FET embodiment 500 after flip-chip solder bumping and die attachment to a PCB 402 through terminals comprising solder bumps 404 in contact with conductive vias 406. FIG. 5 also shows that the SLT process enables formation of a CAS gate 504 proximate the active transistor region (within dotted oval 302) to control capacitive back channel parasitic effects, as further described in U.S. patent application Ser. No. 15/920,321 (electrical connections to the CAS gate 504 omitted for clarity).

An insulating LDC handle wafer 502 provides the mechanical support needed for the transistor structure, necessary because the transistor structural stack 506 is quite thin (e.g., about 10 microns in common FET manufacturing processes). The thin transistor structural stack 506 is extremely fragile and requires a support structure sufficiently rigid and robust to allow subsequent process steps (e.g., die singulation, die picking and placing, etc.) to be performed with acceptable yield levels. In this example, the thickness 508 of the insulating LDC handle wafer 502 may be about 500-700 microns. However, a thickness 508 of less than 500 microns (e.g., 100-200 microns) may be used for many mobile applications where thinness is at a premium (e.g., cellular smart phones).

The insulating LDC handle wafer 502 should be selected so as to exhibit two separate characteristics: being a good electrical insulator and having low dielectric constant. Advantages of being a good electrical insulator are higher Q factor and linearity. For this aspect, the insulating LDC handle wafer 502 may be, for example, glass (e.g., low alkali glass or soda lime glass), quartz or fused silica, sapphire, aluminum nitride, silicon carbide, high temperature co-fired ceramic (HTCC), or low temperature co-fired ceramic (LTCC).

Advantages of having a low dielectric constant are low insertion loss, better isolation, and better voltage division. Importantly, the insulating LDC handle wafer 502 should have a smaller dielectric constant than a silicon substrate. As one example, in one embodiment, a selected glass LDC handle wafer 502 has a dielectric constant ε of about 5.8, while a typical silicon substrate has a dielectric constant of about 11.7 (and may be as high as 12.9 for some types). Typical dielectric constants at 18 GHz for the example insulating LDC handle wafer 502 materials listed above are: glass (~5.8 to ~6.72, although some types of glass may be higher), quartz or fused silica (~3.8 to ~4.2), sapphire (~9.4 perpendicular to C-axis), aluminum nitride (~8.8 to ~10.8), silicon carbide (~9.66 to ~10.03 static, ~6.52 to ~6.6.7 for high frequencies), high temperature co-fired ceramic (HTCC) (~10), or low temperature co-fired ceramic (LTCC) (~5 to ~9).

A third characteristic, high thermal conductivity, would be advantageous, but the few materials with high resistivity, low dielectric constant, and high thermal conductivity characteristics—such as aluminum nitride or silicon carbide—generally have other issues, such as cost, manufacturability, or relatively high dielectric constants, that may restrict their use for some applications.

Replacing a conventional silicon substrate with an insulating LDC handle wafer 502 having good electrical insulation and a dielectric constant less than the dielectric constant of silicon reduces or eliminates nonlinear effects of silicon that may be induced by voltages on the transistor structural stack 506 and that couple back to the active transistor region, thereby distorting signals applied to the transistor. Accordingly, use of an insulating LDC handle wafer 502 reduces insertion loss and non-linearity, increases isolation, provides for more ideal voltage division of stacked transistors, enables a higher Q factor due to lower coupling losses, and otherwise mitigates the parasitic effects discussed above.

The transistor structure shown in FIG. 5 may also include heat extraction structures (see more detailed discussion below with respect to FIGS. 8-11) as taught in U.S. patent application Ser. No. 16/040,295, and/or RDL back gate structures on the (now) bottom surface of the IC (one example is shown as CAS gate 504) as taught in U.S. patent application Ser. No. 15/920,321, with those structures typically formed before solder bumps are added for attachment to a PCB.

Figure 6A:
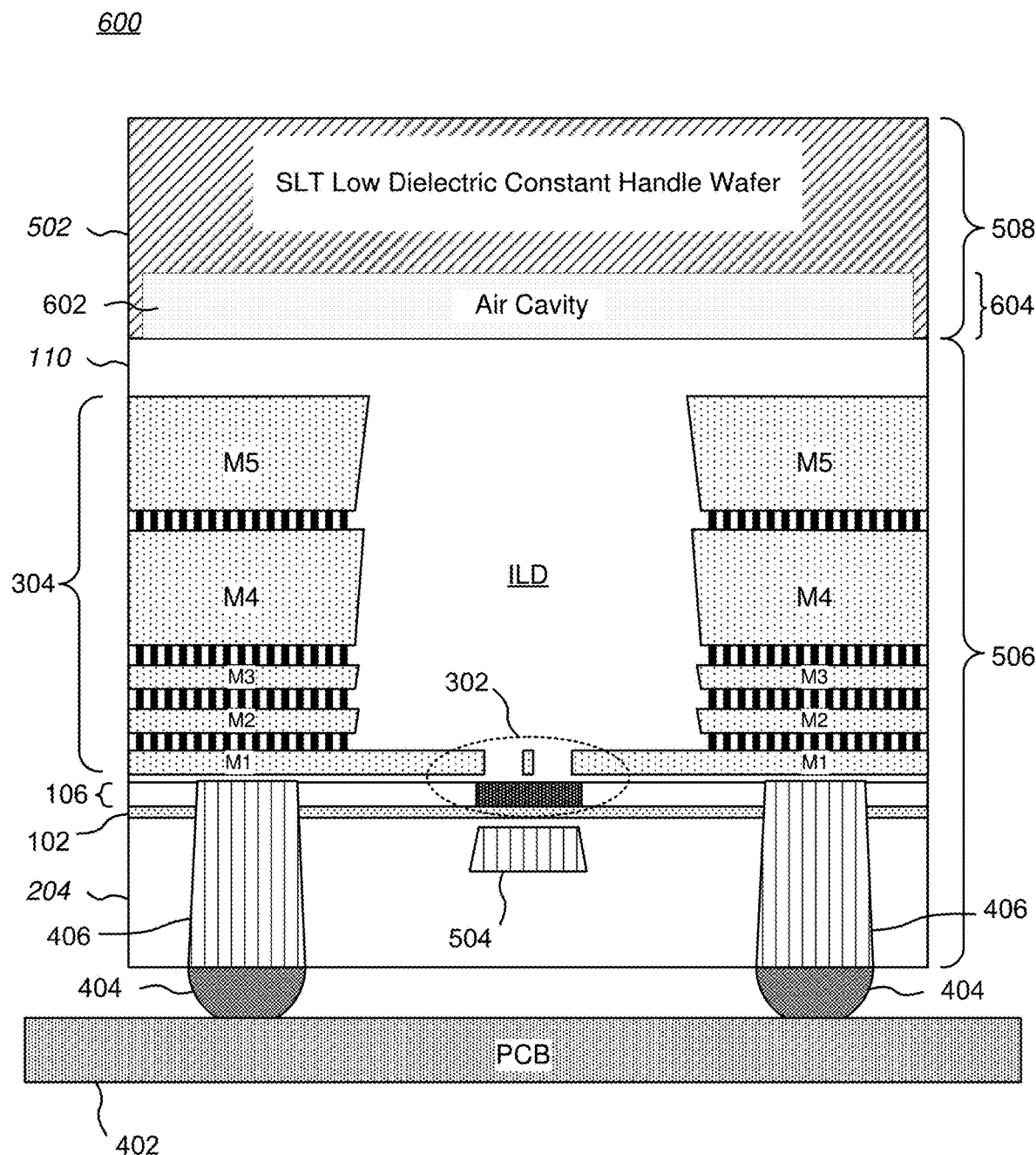
FIG. 6A is a cross-sectional view of a second embodiment of an RF SLT SOI transistor according to the present invention, after attachment to a PCB.

FIG. 6A is a cross-sectional view of a second embodiment 600 of an RF SLT SOI transistor according to the present invention, after attachment to a PCB. In this embodiment, an insulating LDC handle wafer 502 (e.g., glass) has been selectively etched or ground to create at least one air cavity 602 before bonding to the transistor structure. As one example, a glass insulating LDC handle wafer would be etched in a region proximate the metal interconnect layers of a FET to create at least one air cavity. Since the dielectric constant ε of air is about 1.0, the air cavity or cavities further reduce parasitic capacitive coupling. Accordingly, use of an insulating LDC handle wafer 502 etched to create at least one air cavity proximate the metal interconnect layers of an RF FET further reduces the effective dielectric constant of material surrounding the RF FET. Such an embodiment could be highly advantageous when using a material such as aluminum nitride or silicon carbide for the LDC handle wafer 502 to obtain high thermal conductivity while mitigating the relatively higher dielectric constant of such materials. Thus, capacitive coupling between nearby transistors will be reduced, thereby increasing isolation between them. Capacitive coupling between the source and drain sides of each transistor will also decrease, thereby reducing the OFF capacitance ($C_{OFF}$) of the transistor, thus increasing the transistor's figure of merit for switching (equal to the ON resistance RON multiplied by $C_{OFF}$). In one embodiment of the air cavity configuration shown in FIG. 6A, $C_{OFF}$ improved by about 30% compared to a similar embodiment having the non-cavity configuration shown in FIG. 5.

Figure 6B:
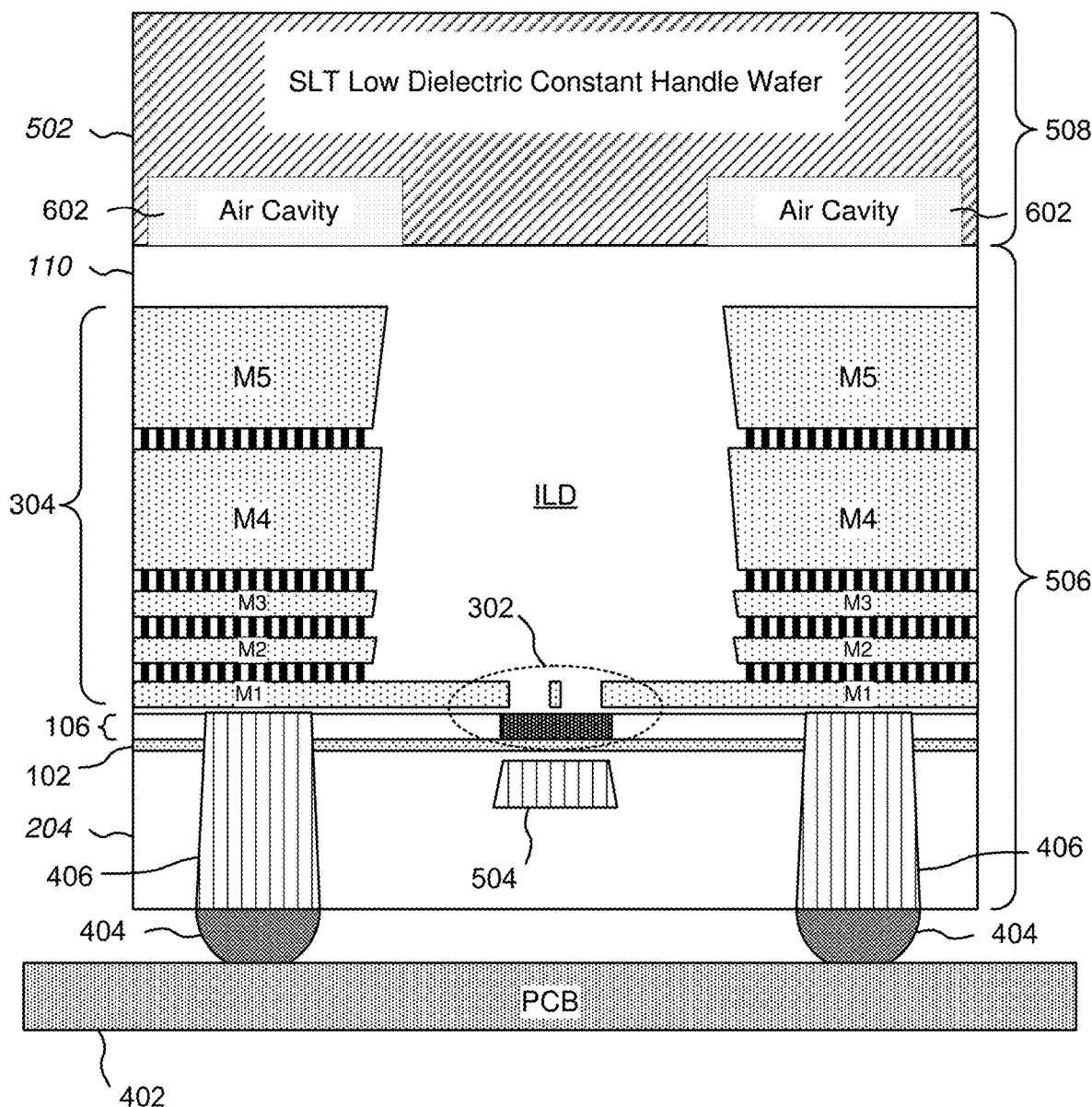
FIG. 6B is a cross-sectional view of a third embodiment of an RF SLT SOI transistor according to the present invention, showing two air cavities.

FIG. 6A shows an insulating LDC handle wafer 502 having a single air cavity 602 proximate a single transistor structure. In alternative embodiments, the single air cavity 602 may span multiple transistor structures, including up to all transistor structures on a single integrated circuit die. More than one air cavity 602 may be used as well. For example, FIG. 6B is a cross-sectional view of a third embodiment 650 of an RF SLT SOI transistor according to the present invention, showing two air cavities 602. Each of the air cavities 602 is situated over an underlying corresponding portion of the metal interconnect layers 304. The average dielectric constant of the insulating LDC handle wafer 502 with dual air cavities would still be lower than a solid insulating LDC handle wafer 502, but would be structurally stronger and more flex resistant than a single air cavity.

It should be noted that in FIGS. 6A and 6B, the metal interconnect layers 304 generally would extend laterally (both across the page and in-and-out of the page), and the air cavity or cavities 602 generally would extend over those laterally extended metal interconnect layers 304 to provide the benefits of reduced capacitive coupling. Note also that the vertical dimensions of the air cavity or cavities 602 with respect to the insulating LDC handle wafer 502 as a whole are not to scale. The air cavity or cavities 602 generally should be reasonably deep in order to reduce the dielectric constant of the insulating LDC handle wafer 502 as seen by nearby transistor structures. For example, if the thickness 508 of an insulating LDC handle wafer 502 is about 500-700 microns, the thickness 604 (see FIG. 6A) of the air cavity or cavities 602 may be about 100-200 microns.

Figure 6C:
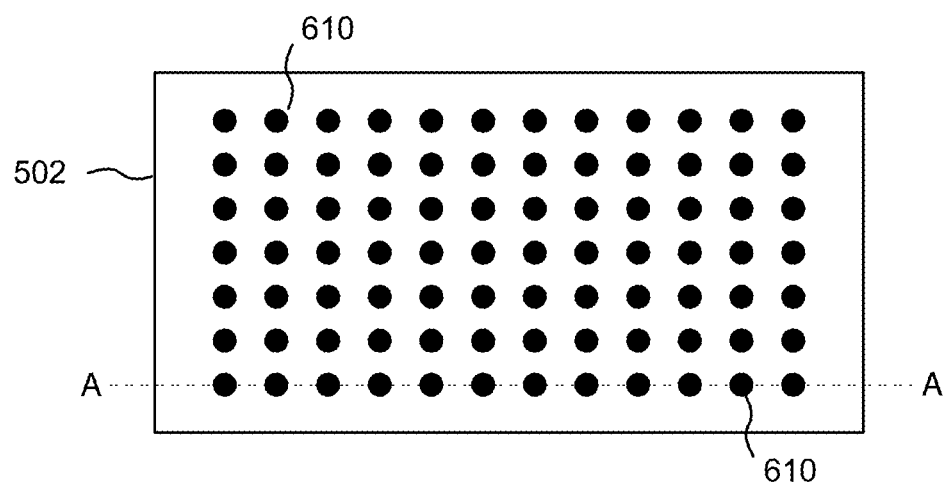
FIG. 6C is a plan view of a rectangular section of an insulating LDC handle wafer having a plurality of perforations.
Figure 6D:
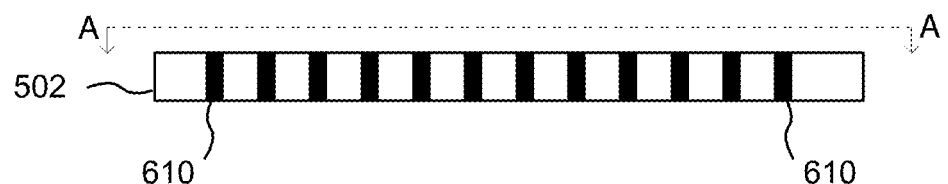
FIG. 6D is a cross-sectional view of the rectangular section of FIG. 6C, taken along line A-A.

FIG. 6C is a plan view of a rectangular section of an insulating LDC handle wafer 502 having a plurality of perforations 610. FIG. 6D is a cross-sectional view of the rectangular section of FIG. 6C, taken along line A-A. In both views, the illustrated section of the insulating LDC handle wafer 502 includes multiple air cavities in the form of the perforations 610, preferably spaced so as to provide at least one an air cavity/perforation proximate each underlying transistor structure, such as the example transistor structure of FIG. 6B. The perforations 610 may be formed, for example, by masking and etching a solid insulating LDC handle wafer 502. The average dielectric constant of the perforated insulating LDC handle wafer 502 would be lower than a solid insulating LDC handle wafer 502, but would be structurally stronger and more flex resistant than a single air cavity. In some embodiments, the perforations 610 may instead be formed as "dead end" air cavities (i.e., open only on the side adjacent a transistor structural stack 506), formed, for example, by etching one side of an insulating LDC handle wafer 502 to a desired depth.

As with the transistor structure shown in FIG. 5, the transistor structure shown in FIGS. 6A and 6B may also include additional heat extraction structures (not shown in FIGS. 6A-6B, but see FIGS. 8-11) as taught in U.S. patent application Ser. No. 16/040,295, and/or RDL back gate structures (one example is shown as CAS gate 504) on the (now) bottom surface of the IC as taught in U.S. patent application Ser. No. 15/920,321.

In summary, in one aspect, embodiments of the invention encompass a semiconductor structure comprising a stack of formed layers, including, in relative order (meaning that other, non-listed layers may be included): an insulating low dielectric constant substrate; at least one metal interconnect layer embedded in insulating dielectric material; a silicon active layer including at least one field effect transistor; a buried oxide layer; and an insulating dielectric material layer. In a preferred embodiment, the insulating low dielectric constant substrate includes at least one air cavity formed proximate the at least one metal interconnect layer.

Dual Layer Transfer Embodiments

Figure 7:
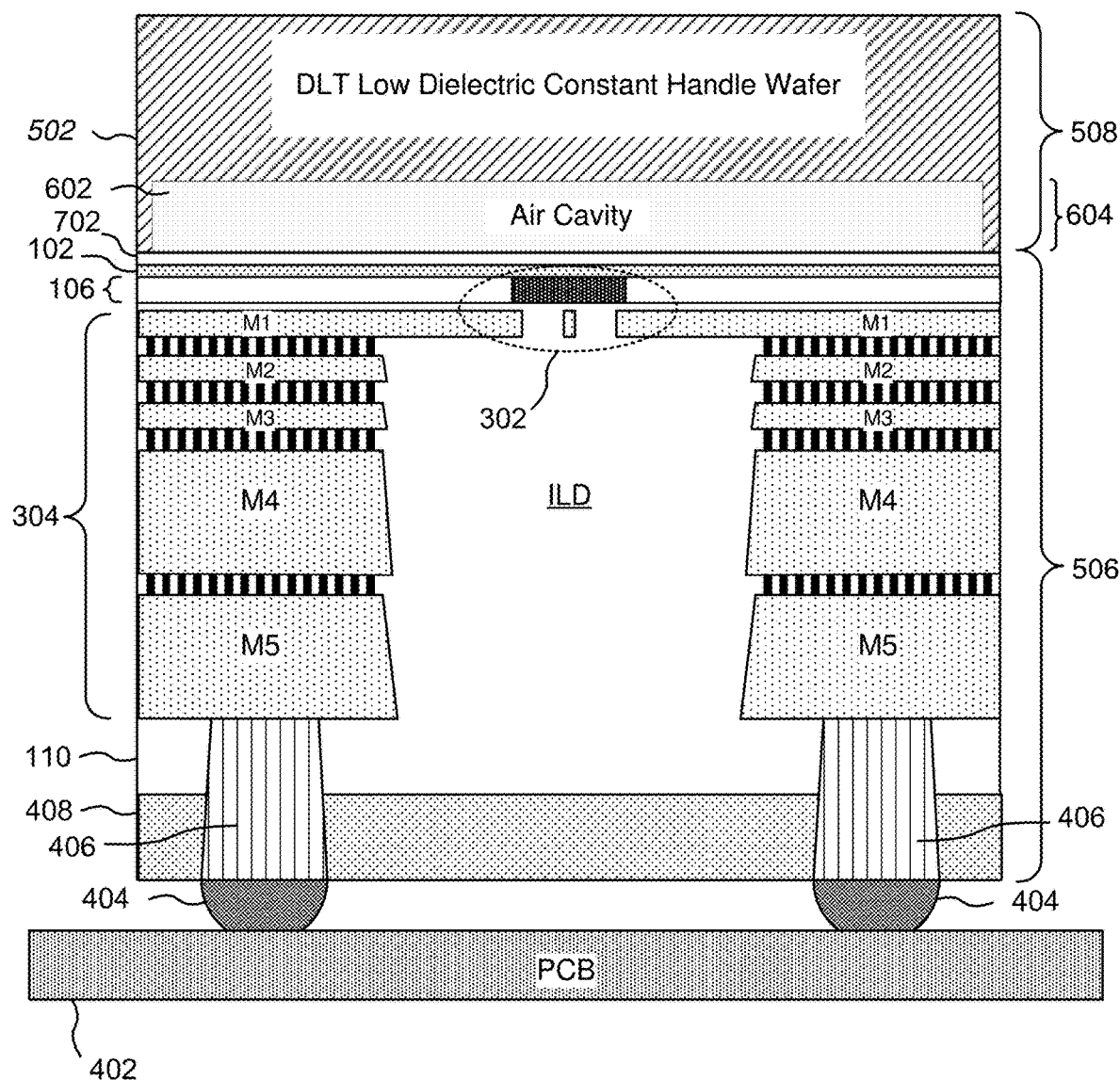
FIG. 7 is a cross-sectional view of a first embodiment of an RF DLT SOI transistor according to the present invention, after attachment to a PCB.

The embodiments of FIGS. 5, 6A, and 6B all utilize a Single Layer Transfer, or SLT, fabrication technique. An alternative embodiment utilizes a Double Layer Transfer, or DLT, fabrication technique. For example, FIG. 7 is a cross-sectional view of a first embodiment of an RF DLT SOI transistor 700 according to the present invention, after attachment to a PCB. In one process, the SOI transistor is fabricated in conventional fashion on a silicon substrate (up to a point), then flipped onto a first handle wafer (e.g., of silicon, not shown), at which point the original silicon substrate is removed, in known fashion, and a protective layer of ILD 702 is deposited on the BOX layer 102. The exposed top of the transistor structure (the protective layer of ILD 702, in this example) is then bonded to a second handle wafer comprising an insulating LDC handle wafer 502, and the first handle wafer is removed. Thereafter, additional steps may be performed, such as flip-chip solder bumping (to the metal interconnect layers 304 of the transistor structure) and die attachment to a PCB 402.

Accordingly, an insulating LDC substrate has replaced the silicon substrate of prior art structures using a Double Layer Transfer process. As with the earlier embodiments, the silicon substrate has been eliminated entirely from the structure and the only semiconducting material is the silicon active layer 106, and FET gates and or non-metal connective structures (typically polysilicon). While the resulting structure has a superficial resemblance to the conventional SOI transistor structure of FIG. 4, the SOI transistor structure of FIG. 4 is fabricated on a silicon substrate 104 and does not make use of any handle wafers. As with the other inventive embodiments described above, the embodiment of FIG. 7 eliminates the parasitic effects caused by traditional SOI transistors for which a silicon substrate has always been required.

As with the embodiments of FIGS. 5, 6A, and 6B, the embodiment of FIG. 7 may utilize an insulating LDC handle wafer 502 having a single air cavity or multiple air cavities, and one or more air cavities may be formed as perforations through the insulating LDC handle wafer 502. An advantage of the embodiment of FIG. 7 is that, while a Double Layer Transfer process is involved in order to provide the insulating LDC handle wafer 502 in lieu of a high dielectric constant silicon substrate 104, the process is otherwise compatible with conventional SOI fabrication steps, such as die singulation, dice picking and placement, and solder bumping and die attachment to a PCB 402.

It should be noted that FIG. 7 as illustrated is the result of a Double Layer Transfer process. In some embodiments, it may be desirable to include a CAS gate for the field effect transistor structure (within the dotted oval 302), as in the embodiment of FIG. 6B. This may be done, for example, by forming a redistribution layer 306 and then forming a CAS gate (not shown in FIG. 7, but see CAS gate 504 in FIG. 6B) after the first SLT transfer. A layer of ILD may then be formed over the CAS gate 504 and RDL 306, followed by a planarizing polish if needed. Thereafter, the second wafer transfer would be performed, leaving the CAS gate 504 and RDL 306 between the active layer 106 and the and the insulating LDC handle wafer 502.

In summary, in one aspect, embodiments of the invention encompass a semiconductor structure comprising a stack of formed layers, including, in relative order (meaning that other, non-listed layers may be included): an insulating low dielectric constant substrate; an insulating dielectric material layer; a buried oxide layer; a silicon active layer including at least one field effect transistor; at least one metal interconnect layer embedded in insulating dielectric material; and a passivation layer.

Heat Extraction Structures

The insulating LDC handle wafer 502 (with or without air cavities) proximate the active regions of the transistor structure will increase thermal resistance as compared to the original silicon substrate, so the addition of heat extraction structures offers the highest overall performance for such RF FETs. For example, one or more of the transistor structures shown in FIGS. 5, 6A, 6B, and 7 may include heat extraction structures as taught in U.S. patent application Ser. No. 16/040,295. More specifically, during fabrication of a FET, one or more electrically-isolated, laterally-extending thermal paths may be formed adjacent the FET and configured to conduct heat laterally away (e.g., "horizontally") from the FET to generally orthogonal (e.g., "vertical") thermal pathways (e.g., vias or heat pipes), and thence to corresponding thermal pads externally accessible at the "top" or "bottom" of the completed integrated circuit (IC). Such a thermal extraction configuration is particularly useful for ICs mounted in a "flip-chip" package.

Figure 8A:
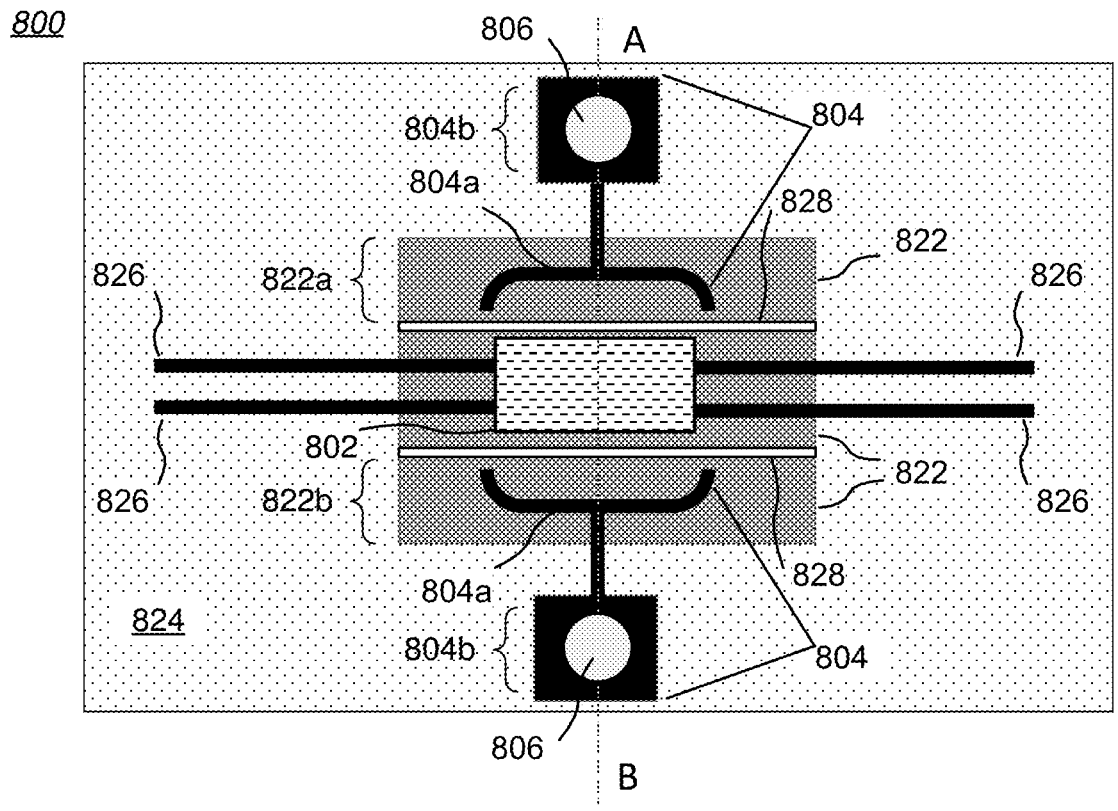
FIG. 8A is a top plan view of an SOI IC FET structure having heat extraction structures, at an intermediate stage of fabrication.
Figure 8B:
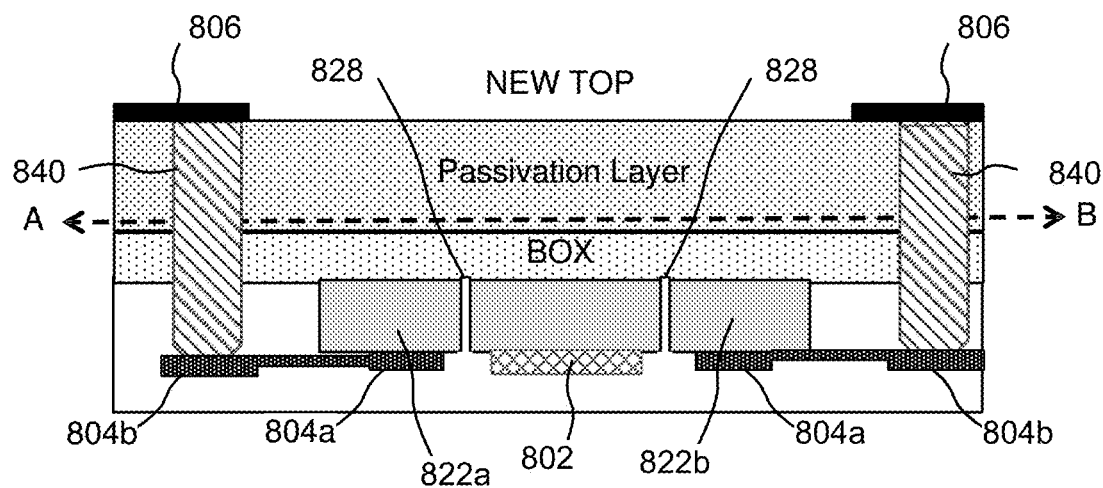
FIG. 8B is a cross-sectional view of the SOI IC FET structure of FIG. 8A at a later stage of fabrication, taken along dashed line A-B of FIG. 8A.

As one example, FIG. 8A is a top plan view of an SOI IC FET structure 820 having heat extraction structures, at an intermediate stage of fabrication. FIG. 8B is a cross-sectional view of the SOI IC FET structure 820 of FIG. 8A at a later stage of fabrication, taken along dashed line A-B of FIG. 8A. In this example, a silicon island 822 has been formed within a field oxide region 824. A silicide layer may be formed in a conventional manner on the exposed surface of the silicon island 822. Within the silicon island 822, a FET device 802 has been formed. In addition, the silicon island 822 is patterned to create electrically isolating structures 828 to electrically isolate the portion of the silicon island 822 containing the FET device 802 from edge portions 822a, 822b of the silicon island 822. Such electrically isolating structures 828 may be made, for example, using shallow trench isolation (STI), a known technique commonly used for preventing electric current leakage between nearby semiconductor device components. One STI process involves etching a pattern of trenches in the silicon island 822, depositing one or more dielectric materials (such as silicon dioxide) to fill the trenches, and removing the excess dielectric using a technique such as chemical-mechanical planarization. However, other techniques may be used for forming the electrically isolating structures 828, such as local oxidation of the silicon regions between transistors (also known as LOCOS isolation).

During the formation of the first metallization connection layer (commonly called "metal 1" or "M1") for the IC FET structure 820, electrical connections 826 are made to the various terminals of the FET device 802 (e.g., source, drain, gate). In addition, in the illustrated example, the M1 layer—which is also thermally conductive and patterned over a first interlevel dielectric layer (ILD)—is patterned to form one or more electrically-isolated, laterally-extending thermal paths 804 each comprising (1) a near portion 804a in thermal contact, through the ILD, with the edge portion 822a, 822b adjacent the FET device 802, and (2) a far portion 804b spaced away from the edge portions 822a, 822b adjacent FET device 802 in a lateral direction (e.g., "horizontally" in FIG. 8B). The far portions 804b may be configured as heat release pads sufficiently large so as to enable good thermal contact with generally orthogonal thermal pathways 840. The near portions 804a should be sufficiently close to the FET device 802 so as to be able to thermally conduct a significant amount of heat away from the FET device 802. The far portions 804b should be sufficiently spaced away from the FET device 802 so that thermal connections can be made to those portions, as in FIG. 8B, without being blocked by or interfering with the FET device 802.

In the illustrated example, the generally orthogonal thermal pathways 840 are thermally coupled to externally accessible thermal pads 806, which may be coupled to a conventional heat sink. While FIG. 8B shows an SLT-type SOI FET and generally orthogonal thermal pathways 840 projecting upward with respect to the FET device 802, in other embodiments, the generally orthogonal thermal pathways 840 may project downward to different externally accessible thermal pads (see FIG. 9 and accompanying description).

To be clear, heat generated by the FET device 802 (especially at its drain D) will flow laterally through the active region of the FET device 802, thence through the electrically isolating structures 828, and finally through edge portions 822a, 822b. After this lateral heat diffusion, the transistor-generated heat will diffuse vertically through the ILD layer situated between the edge regions 822a, 822b and the M1 layer, and thence into the near and far portions 804a, 804b of the electrically-isolated, laterally-extending thermal paths 804, respectively, that are patterned from the M1 layer. Since the M1 layer is an excellent heat conductor, the near portions 804a will conduct heat to the far portions 804b of the electrically-isolated, laterally-extending thermal paths 804, and ultimately on to an external heat sink (such as the thermal pads 806 in FIG. 8B). Properly constructed, the near and far portions 804a, 804b of the electrically-isolated, laterally-extending thermal paths 804 will enable much lower thermal resistance from the FET device 802 through the generally orthogonal thermal pathways 840 to the externally accessible thermal pads 806.

Thus, the purpose of the electrically-isolated, laterally-extending thermal paths 804 is to conduct heat away from the FET device 802 in a lateral direction when fabrication of the IC FET structure 820 is finished. Note that while FIG. 8A shows electrically-isolated, laterally-extending thermal paths 804 placed on two sides of the FET device 802, in some embodiments, one electrically-isolated, laterally-extending thermal path 804 may be sufficient (particularly on the drain D side of the FET device 802); such a configuration may also require less area on an IC. Note also that the material on which the M1 metallization layer is formed (e.g., a silicide) may be etched and backfilled with conductive material to form vias such that the M1 layer is in more direct thermal contact with the edge portions 822a, 822b of the silicon island 822.

In FIG. 8B, further steps of fabrication using an SLT process are shown. In particular, the IC FET structure 820 of FIG. 8A has been "flipped" over onto a handle wafer, as described above. Accordingly, the FET device 802 now faces "downward", away from the "new top" of the entire structure. The near portion 804a of the electrically-isolated, laterally-extending thermal paths 804 is positioned adjacent a respective edge region 822a, 822b and close to the FET device 802 (ideally, as close as possible under a set of applicable IC design rules). The far portion 804b of the electrically-isolated, laterally-extending thermal paths 804 extends laterally from the FET device 802 sufficient that generally orthogonal (e.g., "vertical") thermal pathways (e.g., vias or heat pipes) 840 of a thermally conductive material (e.g., copper or aluminum) can be fabricated through the Passivation Layer and the BOX layer to be in intimate thermal contact with the far portion 804b of the electrically-isolated, laterally-extending thermal paths 804. In the illustrated example, the generally orthogonal thermal pathways 840 may be formed, for example, by etching holes through the Passivation Layer and the BOX layer and filling the holes with the thermally conductive material, using known techniques. Note that some fabrication design rules for particular IC foundries may not allow use of a single large diameter orthogonal thermal pathway 840, and accordingly the single thermal pathways 840 illustrated in FIG. 8B may be replaced by multiple, smaller-diameter thermal pathways 840 (e.g., multiple vias).

Each generally orthogonal thermal pathway 840 may be capped by a thermal pad 806 made of a thermally conductive material. If the thermal pathways 840 are made of copper, then the material for the thermal pads 806 would generally be aluminum, to avoid oxidation of the copper. The thermal pads 806 may be fashioned as part of the RDL process for forming a CAS gate for the FET device 802, as in FIGS. 5, 6A, and 6B. Of course, other heat conducting materials compatible with IC fabrication processes may be used for both the generally orthogonal thermal pathways 840 and the thermal pads 806.

Of note, using STI trenches for the electrically isolating structures 828 is particularly beneficial, since STI trenches can be made very narrow (e.g., about 200 nm, or 2000 Angstroms) and they run the entire width of the active transistor region (i.e., silicon island 822). Accordingly, the thermal resistance from the FET device 802 to the electrically-isolated, laterally-extending thermal paths 804 through STI trenches is much less than the thermal resistance through to either the top or the bottom of the completed SOI IC structure 800.

While using the M1 metallization layer to form the electrically-isolated, laterally-extending thermal paths 804 is quite convenient from a fabrication point of view, it is also possible to use other metallization layers (including custom layers) or to combine metallization layers. For example, one or more generally orthogonal thermal pathways may be formed in thermal contact with the electrically-isolated edge portions 822a, 822b of the silicon island 822 so as to be thermally coupled to the edge portions 822a, 822b. Such orthogonal thermal pathways may then be thermally coupled to lateral thermal paths formed from a metallization layer or layers other than M1. Other generally orthogonal thermal pathways 840 and corresponding thermal pads 806 may then be thermally coupled to the lateral thermal paths, similar to the configuration of FIG. 8B.

It should be understood that "electrically isolated", in the context of this disclosure, refers to substantially isolated from direct current flow. As a person of skill will understand, AC coupling through capacitor-like structures is inherent in conductor/insulator/conductor structures such as described above. Such AC coupling can be managed and mitigate by known design techniques.

Figure 9:
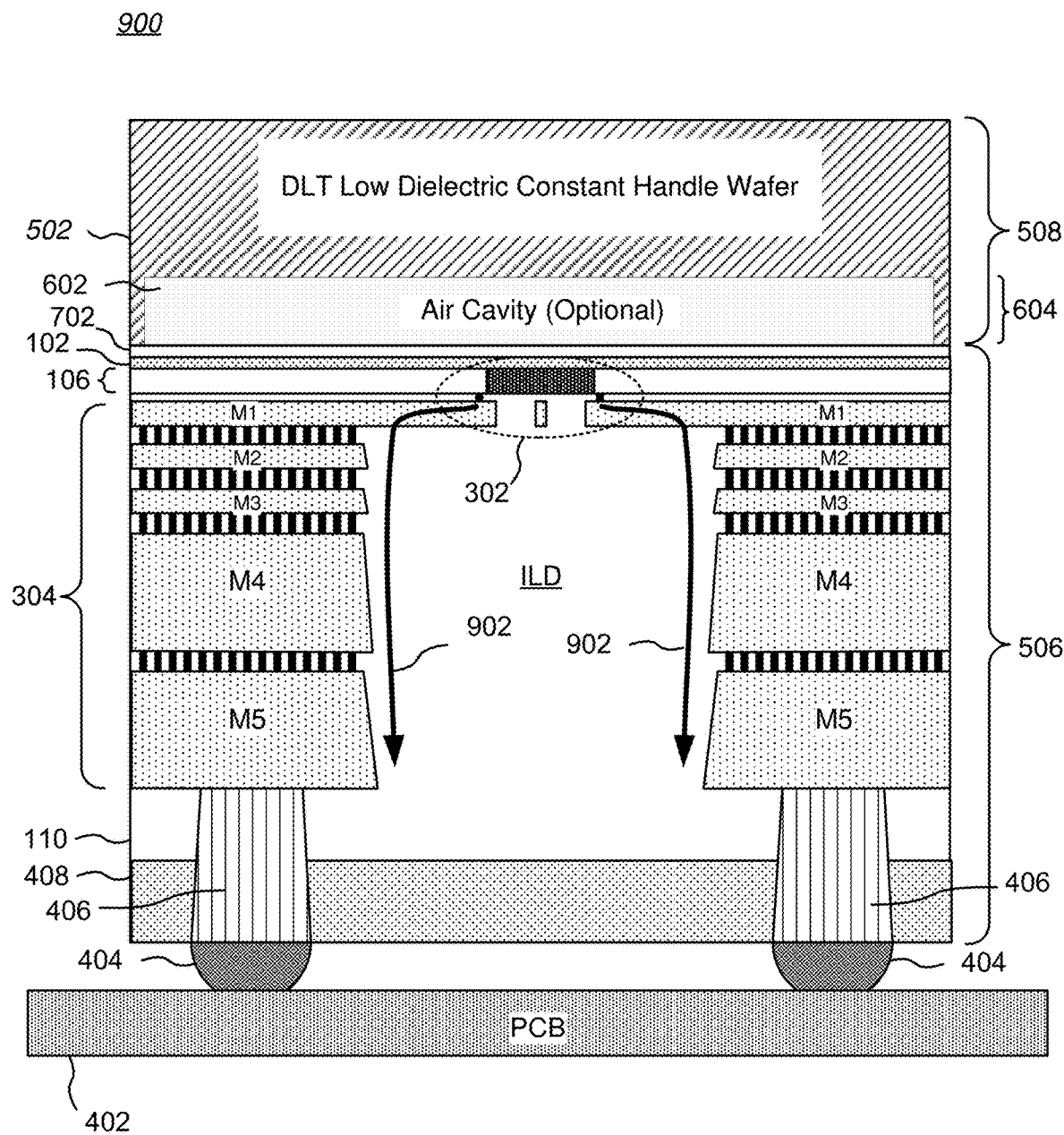
FIG. 9 is a cross-sectional view of one embodiment of an SOI IC structure for a single FET which has been configured to conduct heat away from the FET to the "bottom" of the IC structure, as depicted by heat flow arrows.

FIG. 9 is a cross-sectional view of one embodiment of an SOI IC structure 900 for a single FET structure (within the dotted oval 302) which has been configured to conduct heat away from the FET device 302 to the "bottom" of the IC structure 900, as depicted by heat flow arrows 902. The IC structure 900 is formed in essentially the same manner as the IC structure of FIGS. 7 and 8A. Thus, as in FIG. 8A, the thermally-conductive M1 layer is patterned to form one or more electrically-isolated, laterally-extending thermal paths having a near portion 804a in thermal contact with the FET device 302 and a far portion 804b spaced away from the FET device 302 in a lateral direction, in the manner described above. As with the embodiment of FIG. 7, a CAS gate 504 may be formed with respect to the FET device 302 before adding the insulating LDC handle wafer 502, as described above.

The metal interconnect layers 304 can be patterned and interconnected, in known fashion, to provide lateral thermal pathways and vertical thermal pathways (e.g., "vertical" with respect to the plane of the FET device 302 in FIG. 9). In particular, vertical structures in the metal interconnect layers (e.g., vias) can be formed to provide generally orthogonal, electrically-isolated, thermal pathways—"thermal vias"—from the metal interconnect layer nearest the FET device 302 (i.e., M1 in this example, and thus including the electrically-isolated, laterally-extending thermal paths 804 of FIGS. 8A and 8B) to the last metal interconnect layer (M5 in this example). Patterning and interconnecting the metal interconnect layers to create such thermal vias would be done as part of normal fabrications steps—that is, no additional fabrication steps would be required, only reconfiguration of the existing masks. In the illustrated example, the M5 metal interconnect layer is thermally coupled to the PCB 402 through the conductive vias 406 and solder bumps 404.

An advantage of the configuration shown in FIG. 9 is that essentially no added fabrication steps are needed, since the metal interconnect layers 304 for the thermal vias (i.e., generally orthogonal, electrically-isolated, thermal pathways) are formed as part of the normal fabrication process for the IC structure.

The embodiments shown in FIGS. 8A-8B and 9 utilize electrically isolating structures 828 (e.g., STI trenches) to electrically isolate the portion of a silicon island 822 containing a FET device 802 from edge portions 822a, 822b of the silicon island 822, and then using a metallization layer (typically the M1 layer) for electrically-isolated, laterally-extending thermal paths 804 from the edge portions 822a, 822b away from the FET device 802, 302. However, these STI-like structures are quite large when compared to a typical MOS gate oxide (GOX) thickness, which may be less than 30 Ångströms thick. Accordingly, in some embodiments, the electrically-isolated, laterally-extending thermal paths 804 may instead take advantage of and include one or more dummy gates each comprising a polysilicon gate-like structure formed on GOX over an extended active region (typically in the gate length, L, direction) and specially configured to conduct heat in the following sequence: laterally away from a FET along the extended active region; vertically through the thin (i.e., low thermal resistance) GOX; laterally along the dummy gates; vertically to regions of the M1 layer in contact with the dummy gate; and finally to generally orthogonal thermal pathways (e.g., vertical heat pipes and/or interconnection metallization structures) to external heat sinks (e.g., the externally accessible thermal pads 806 of FIG. 8B), thereby avoiding utilizing higher thermal resistance STI-like structures.

Figure 10A:
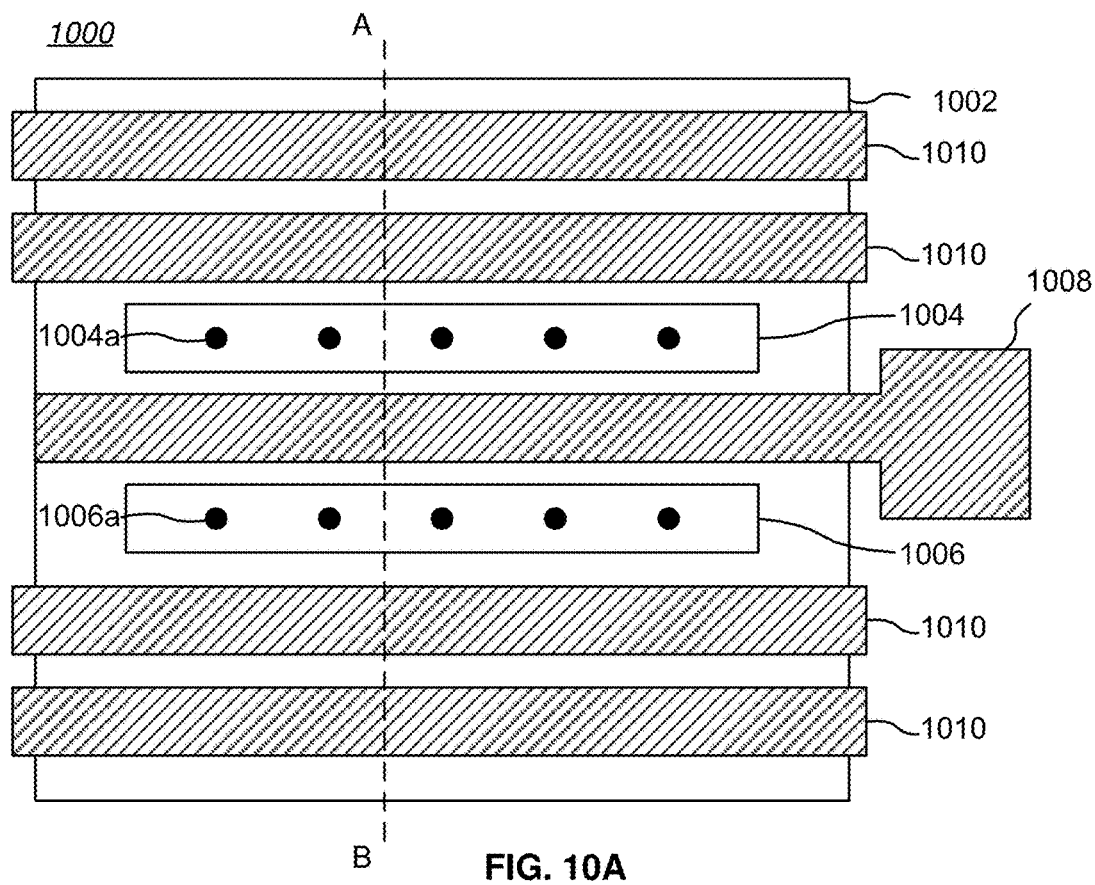
FIG. 10A is a top plan view of a conventional SOI IC FET structure at an intermediate stage of fabrication.
Figure 10B:
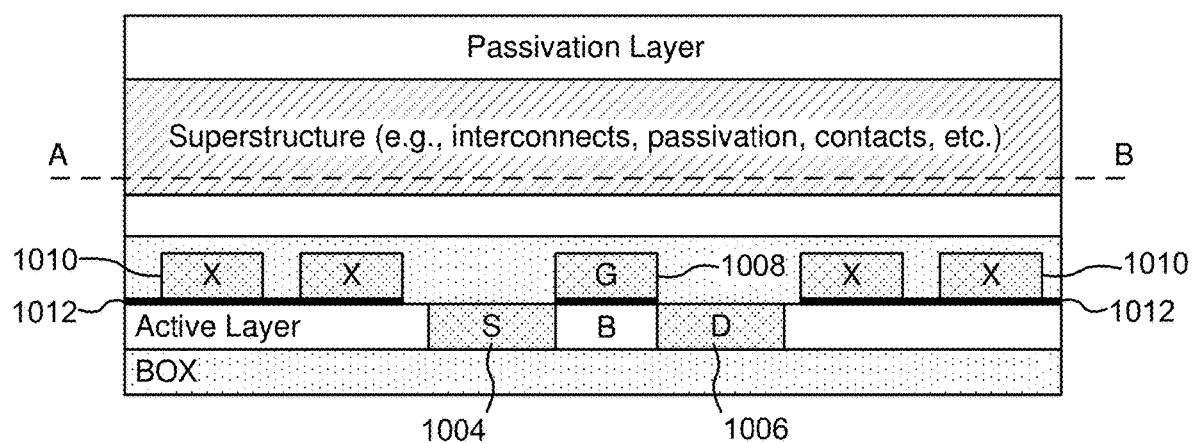
FIG. 10B is a cross-sectional view of the SOI IC FET structure of FIG. 10A at a later stage of fabrication, taken along line A-B of FIG. 10A.

FIG. 10A is a top plan view of a conventional SOI IC FET structure 1000 at an intermediate stage of fabrication. FIG. 10B is a cross-sectional view of the SOI IC FET structure 1000 of FIG. 10A at a later stage of fabrication, taken along line A-B of FIG. 10A. In the illustrated example, a silicon island 1002 encompasses a FET comprising a source region underlying a metallization layer 1004 with associated contacts 1004a, and a drain region underlying a metallization layer 1006 with associated contacts 1006a. The source and drain regions are separated by a body B underlying and defined by a gate 1008. The gate 1008 is typically made of polysilicon overlying a gate oxide layer 1012 grown on the silicon island 1002. In some processes, dummy gates 1010 ("X" elements in FIG. 10B) may be formed when the gate 1008 is formed, and used for various purposes (e.g., electrical isolation, to meet particular design rule density constraints, etc.). Like the gate 1008, the dummy gates 1010 are generally made of polysilicon overlying the gate oxide 1012 on the silicon island 1002, typically with an over-layer of silicide, and extending beyond the edges of the silicon island 1002. However, unlike the gate 1008, the dummy gates 1010 are not electrically connected, and they do not always have doped (e.g., N+) regions or silicide regions implanted in the active region separating adjacent dummy gates 1010 (N+ and silicide regions are not shown in FIG. 10B).

As noted above, the main barrier to heat flow within IC FETs is the many different layers of ILD (e.g., SiO$_2$) or other insulating layers. As has been noted, the STI separation regions described above may be made quite narrow by lateral dimension standards, typically about 2000 Angstroms. However, one of the thinnest insulators in a FET, and therefore the lowest thermal resistance path (of the insulating layers in an IC FET) is through the gate oxide 1012, with typical thicknesses of tens of Ångströms. Further, the gate material, typically polysilicon, is a relatively good thermal conductor. These characteristics can be adapted to provide lateral thermal paths to conduct heat away from a FET.

Figure 11A:
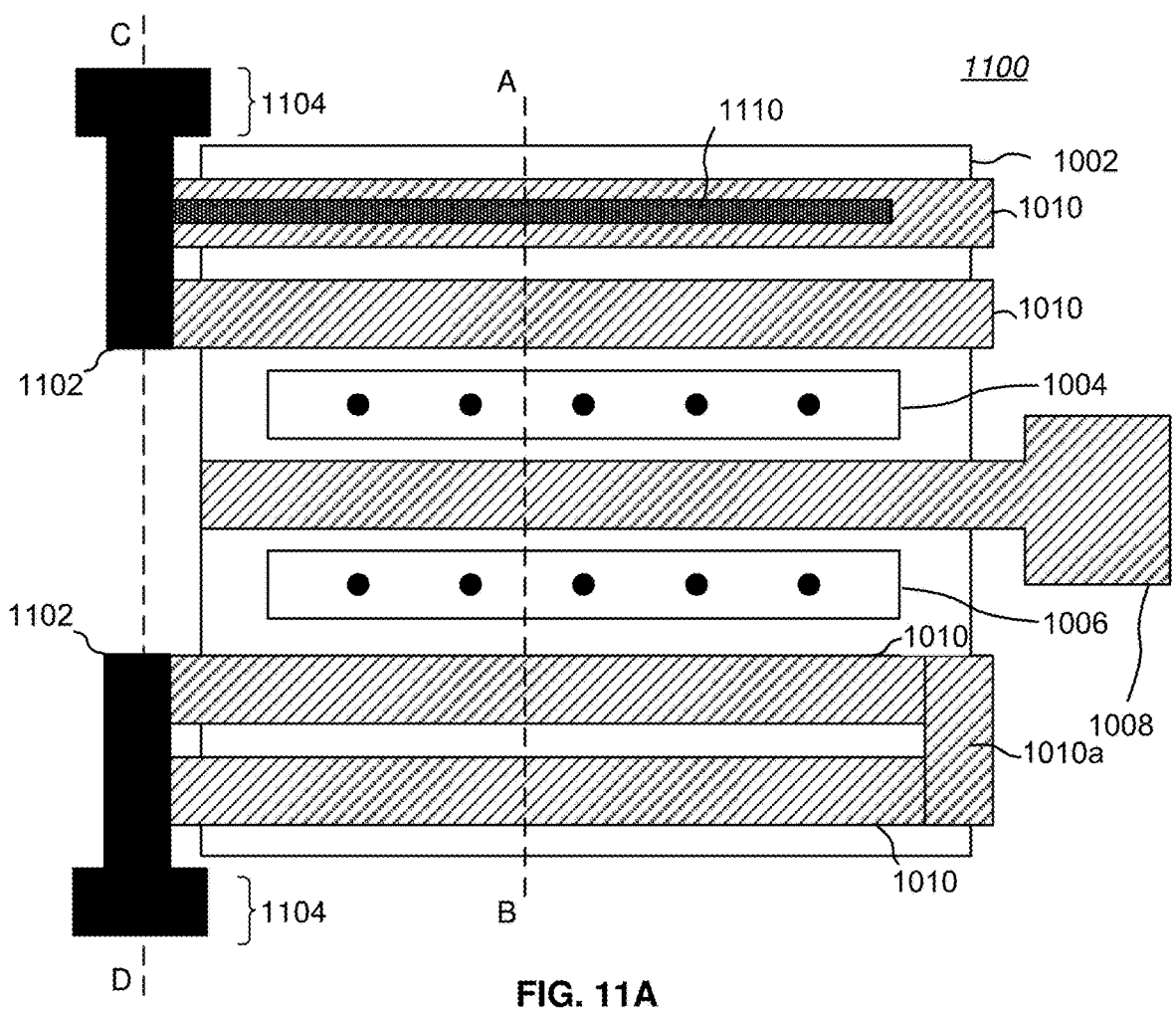
FIG. 11A is a top plan view of a SOI IC FET structure at an intermediate stage of fabrication, including thermally-coupled dummy gates.
Figure 11B:
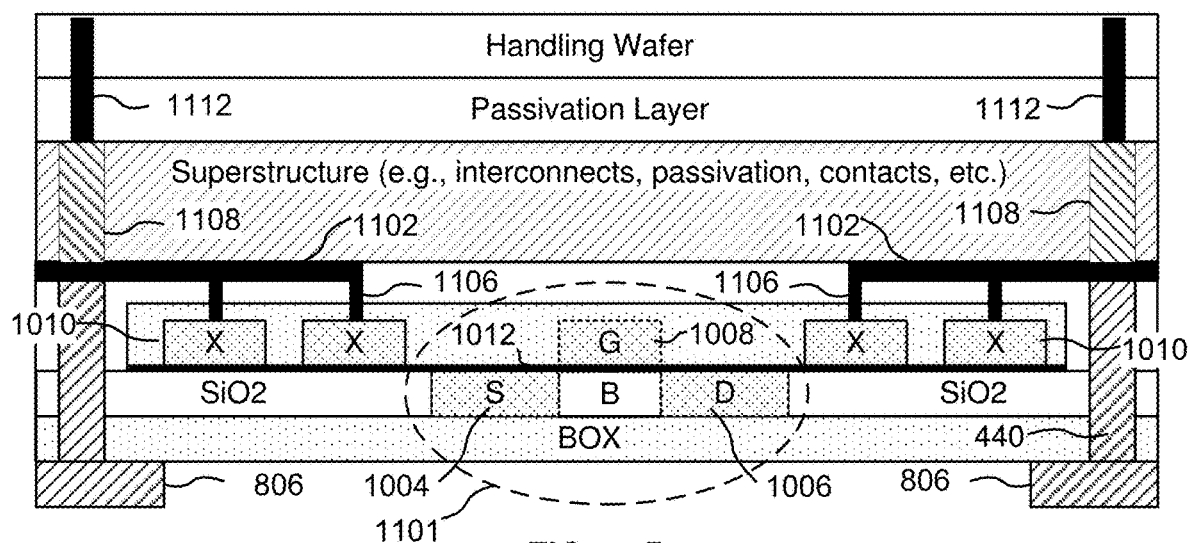
FIG. 11B is a cross-sectional view of the SOI IC FET structure of FIG. 11A after application of back-side access process, such as SLT.

As an example, FIG. 11A is a top plan view of a SOI IC FET structure 1100 at an intermediate stage of fabrication, including thermally-coupled dummy gates 1010. FIG. 11B is a cross-sectional view of the SOI IC FET structure 1100 of FIG. 11A after application of back-side access process, such as SLT. More specifically, FIG. 11B is a cross-sectional view taken along both line C-D (for foreground features) and line A-B (for background features) of FIG. 11A. The transistor structure of FIG. 11A (i.e., from the cross-section taken through line A-B of FIG. 11A) is shown within oval 1101 of FIG. 11B in dotted outline for reference. Other elements of FIG. 11B are from the cross-section though line C-D of FIG. 11A (line C-D does not cut through the transistor). In addition, the gate oxide 1012 layer, while appearing to overlay the source S and drain D of the transistor, does not do so, but instead would be configured as in FIG. 10B near the transistor.

In the example illustrated in FIGS. 11A and 11B, one or more of the dummy gates 1010 are formed so as to extend out beyond the edge of the silicon island 1002. One or more of the dummy gates 1010 are connected by one or more thermally conductive structures 1102 that may extend to heat release pads 1104. The thermally conductive structure 1102 may be, for example, part of the M1 layer connected to the dummy gates 1010 by thermally-conductive vias 1106, as shown in FIG. 11B. Heat generated by the FET is conducted by the "near" (with respect to the FET) dummy gates 1010 through the vias 1106 to the thermally conductive structures 1102 of the M1 layer, and thence laterally to "far" heat release pads 1104 (FIG. 11A).

As in the configuration of FIG. 8B, each heat release pad 1104 may be thermally coupled to a generally orthogonal thermal pathway and thence to a thermal pad 806 on the BOX side of the structure. Each heat release pad 1104 also may be thermally coupled to patterned metal interconnect layers 1108 (such as M1-M5) of the device superstructure and to thermal vias 1112.

Heat from the FET to the heat release pads 1104 thus flows through the entire area of the silicon island 1002 that is covered by the dummy gates 1010, passing through the extremely thin gate oxide material underneath the dummy gates 1010. Compared to an embodiment that utilizes electrically-isolating STI trenches, the illustrated "trenchless" configuration reduces thermal resistance substantially (by as much as the ratio of the planar width of an STI trench to the thickness of a gate oxide), due to elimination of the series thermal resistance of the STI trench. An additional advantage of this embodiment is that the thermally conductive polysilicon dummy gates 1010 are often thicker than the underlying silicon island 1002, further reducing lateral thermal resistance.

While FIG. 11A shows two thermally conductive structures 1102 and associated heat release pads 1104 coupled to the pairs of dummy gates 1010 at the left side of the illustrated silicon island 1002, in some embodiments, one thermally conductive structure 1102 and associated heat release pad 1104 may be sufficient (particularly on the drain D side of the FET); such a configuration may also require less area on an IC. Since the dummy gates 1010 extend past both the left and right sides of the illustrated silicon island 1002, thermally conductive structures 1102 and associated heat release pads 1104 may be formed on both the left side (as shown) and right side (not shown) of the silicon island 1002. Further, while the illustrated thermally conductive structures 1102 and associated heat release pads 1104 are shown coupled to pairs of dummy gates 1010, in general, thermally conductive structures 1102 and associated heat release pads 1104 may be coupled to one or more dummy gates 1010. In some embodiments, the illustrated groups (i.e., two or more per drain and/or source side of the FET) of dummy gates may be replaced with a single wide dummy gate (in effect, the dummy gate would thermally short out the active area).

In some embodiments, the connection of the thermally conductive structures 1102 to the dummy gates 1010 may be made at positions other than an end (i.e., along dashed line A-B through thermal vias to electrically isolated thermally conductive structures 1102), and more than one thermally conductive structure 1102 per "side" of the gate 1008 may be used. One or more of the dummy gates 1010 may be interconnected to one or more other dummy gates 1010 by, for example, using polysilicon "straps" (such as strap 1010a in FIG. 11A) to span two or more dummy gates 1010 and thus increase the number of thermal pathways. One or more straps 1010a can be formed at the ends of the dummy gates 1010 or across the middle portions of the dummy gates 1010. Such a configuration may better collect heat for conduction through the thermally conductive structures 1102.

In a variation of the embodiment of FIG. 11A, extensions of the M1 layer of the thermally conductive structure 1102 may be deposited over substantially the length of one or more dummy gates 1010 and thermally coupled to those dummy gates 1010 by thermally-conductive vias, similar to the vias 11010 shown in FIG. 11B. For example, in FIG. 11A, one such extension 1110 of the M1 layer is shown overlying the uppermost dummy gate 1010; such a structure is often called a "strapped gate", meaning metal contacts the polysilicon over the active area. The M1 layer provides even better thermal conductivity than the polysilicon of the dummy gates 1010, and accordingly such a configuration allows better control of heat.

Additional details of structure and fabrication methods for mitigating heat flow may be found in U.S. patent application Ser. No. 16/040,295, referenced above.

Methods

Figure 12:
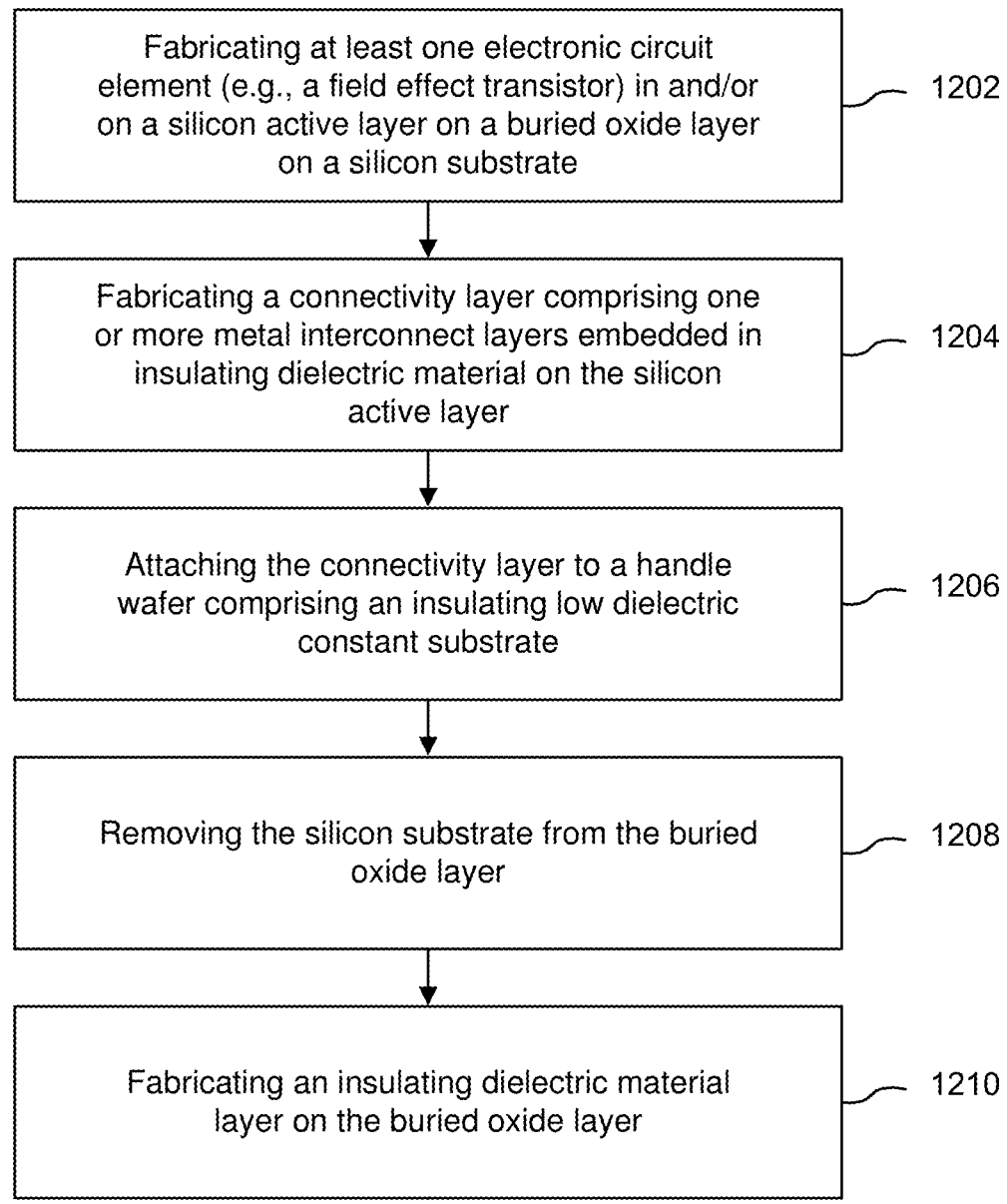
FIG. 12 is a process flow diagram of a first method of fabricating a low parasitic capacitance transistor.

Another aspect of the invention includes methods for fabricating transistor structures, particularly RF MOSFET signal switches, that have low parasitic capacitance. For example, FIG. 12 is a process flow diagram 1200 of a first method of fabricating a low parasitic capacitance transistor. The method includes: fabricating at least one electronic circuit element (e.g., a field effect transistor) in and/or on a silicon active layer on a buried oxide layer on a silicon substrate (Block 1202); fabricating a connectivity layer comprising one or more metal interconnect layers embedded in insulating dielectric material on the silicon active layer (Block 1204); attaching the connectivity layer to a handle wafer comprising an insulating low dielectric constant substrate (Block 1206); removing the silicon substrate from the buried oxide layer (Box 1208); and fabricating an insulating dielectric material layer on the buried oxide layer (Box 1210).

Figure 13:
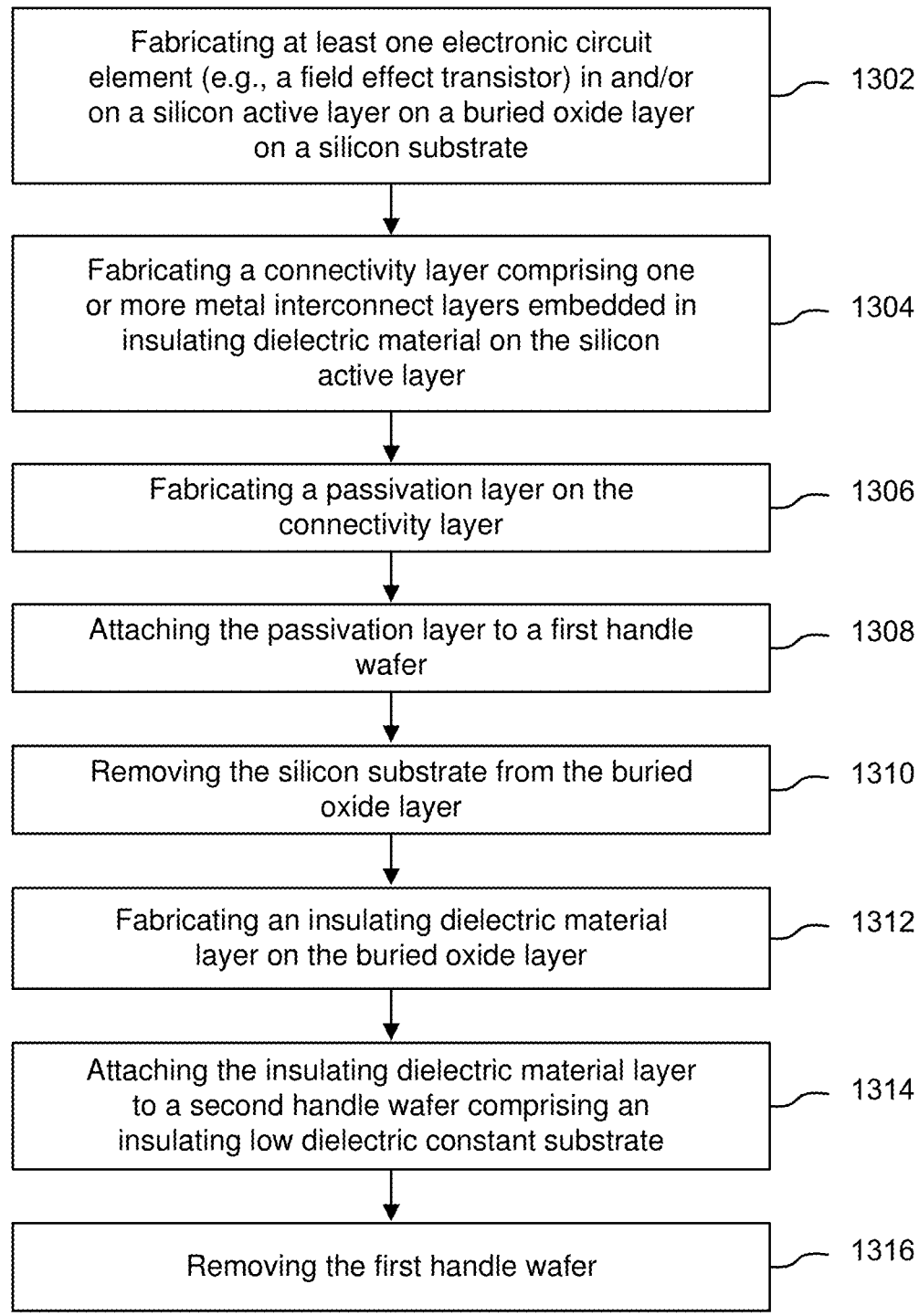
FIG. 13 is a process flow diagram of a second method of fabricating a low parasitic capacitance transistor.

As another example, FIG. 13 is a process flow diagram 1300 of a second method of fabricating a low parasitic capacitance transistor. The method includes: fabricating at least one electronic circuit element (e.g., a field effect transistor) in and/or on a silicon active layer on a buried oxide layer on a silicon substrate (Block 1302); fabricating a connectivity layer comprising one or more metal interconnect layers embedded in insulating dielectric material on the silicon active layer (Block 1304); fabricating a passivation layer on the connectivity layer (Block 1306); attaching the passivation layer to a first handle wafer (Block 1308); removing the silicon substrate from the buried oxide layer (Box 1310); fabricating an insulating dielectric material layer on the buried oxide layer (Box 1312); attaching the insulating dielectric material layer to a second handle wafer comprising an insulating low dielectric constant substrate (Block 1314); and removing the first handle wafer (Block 1316).

Optionally, the above methods may include one or more of the following: fabricating at least one air cavity in the insulating low dielectric constant substrate proximate the one or more metal interconnect layers; wherein the insulating low dielectric constant substrate is one of the following: glass, quartz, fused silica, sapphire, aluminum nitride, silicon carbide, high temperature co-fired ceramic (HTCC), or low temperature co-fired ceramic (LTCC); wherein the insulating low dielectric constant substrate has a dielectric constant less than the dielectric constant of silicon; wherein the insulating low dielectric constant substrate has a dielectric constant no greater than about 10.8; wherein the insulating low dielectric constant substrate has a dielectric constant less than about 7.

For either of the example methods shown in FIGS. 12 and 13, other process steps may be included (many of which are known in the art), such as fabrication of passivation layers and/or regions, isolation structures, external connections, special doping and structural configurations for the FET, etc. Optionally, the insulating low dielectric constant substrate may include one or more air cavities proximate the one or more metal interconnect layers or active transistor regions. The thermal extraction structures and configurations of this disclosure and as taught in U.S. patent application Ser. No. 16/040,295 may be included. In addition, the CAS gate structures and configurations of this disclosure and as taught in U.S. patent application Ser. No. 15/920,321 may be included.

Fabrication Technologies & Options

As should be appreciated by one of ordinary skill in the art, other and/or different materials and process steps (e.g., adding layers and/or structures) may be included or substituted for the materials and process steps described above.

As used in this specification, the term "proximate" means "close" or "very near"; "proximate" thus encompasses "adjoining" and "adjacent", but does not exclude intervening structures or layers that may somewhat space a first structure or element from a second structure or element.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this specification, the term "radio frequency" (RF) refers a rate of oscillation in the range of about 3 kHz to about 300 GHz. This term also includes the frequencies used in wireless communication systems. An RF frequency may be the frequency of an electromagnetic wave or of an alternating current in a circuit.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A semiconductor structure comprising a silicon active layer including:
   (a) a first and a second surface;
   (b) a transistor device formed in and/or on the silicon active layer and including a source and a drain;
   (c) a first insulating layer proximate a portion of the first surface of the silicon active layer;
   (d) a second insulating layer proximate a portion of the second surface of the silicon active layer;
   (e) a set of at least one patterned metal interconnect layer proximate the second insulating layer;
   (f) a third insulating layer proximate the set of at least one patterned metal interconnect layer; and
   (g) an insulating low dielectric constant substrate proximate the third insulating layer and including at least one air cavity positioned with respect to the transistor device so as to reduce capacitive coupling between the source and the drain of the transistor device.

2. The invention of claim 1, further including a redistribution layer proximate the first insulating layer.

3. The invention of claim 1, wherein the at least one air cavity is formed proximate the set of at least one patterned metal interconnect layer.

4. The invention of claim 1, wherein the insulating low dielectric constant substrate is one of the following: glass, quartz, fused silica, sapphire, aluminum nitride, silicon carbide, high temperature co-fired ceramic (HTCC), or low temperature co-fired ceramic (LTCC).

5. The invention of claim 1, wherein the insulating low dielectric constant substrate has a dielectric constant less than the dielectric constant of silicon.

6. The invention of claim 1, wherein the insulating low dielectric constant substrate has a dielectric constant no greater than about 10.8.

7. The invention of claim 1, wherein the insulating low dielectric constant substrate has a dielectric constant less than about 7.

8. The invention of claim 1, wherein the transistor device comprises a MOSFET having a source, a body, a gate, and a drain formed in and/or on the silicon active layer.

9. The invention of claim 8, further including a conductive aligned supplemental (CAS) gate proximate the first insulating layer such that the CAS gate and at least a portion of the first insulating layer situated between the CAS gate and the MOSFET are positioned with respect to the source, the drain, and the body of the MOSFET so as to function as a field effect transistor.

10. A semiconductor structure comprising a silicon active layer including: a first and a second surface; a transistor device formed in and/or on the silicon active layer, wherein the transistor device comprises a MOSFET having a source, a body, a gate, and a drain formed in and/or on the silicon active layer; a first insulating layer proximate a portion of the first surface of the silicon active layer; a second insulating layer proximate a portion of the second surface of the silicon active layer; a set of at least one patterned metal interconnect layer proximate the second insulating layer; a third insulating layer proximate the set of at least one patterned metal interconnect layer; and an insulating low dielectric constant substrate proximate the third insulating layer and including at least one air cavity;
   wherein the MOSFET is formed within a portion of a silicon island formed within a field oxide region of the silicon active layer, and further including a thermal conduction structure for the MOSFET that includes:
   (a) at least one electrically isolating structure formed within the silicon island, each electrically isolating structure positioned so as to electrically isolate the portion of the silicon island containing the MOSFET from an edge portion of the silicon island, each edge portion located in a lateral direction from the MOSFET but thermally coupled through a respective electrically isolating structure to the portion of the silicon island containing the MOSFET;

(b) an interlevel dielectric layer formed over at least one of the at least one electrically isolating structure;

(c) at least one thermal path having a first portion in thermal contact, through the interlevel dielectric layer, with a respective edge portion of the silicon island, and a second portion spaced away from the respective edge portion of the silicon island in a lateral direction from the MOSFET so that the second portion may be coupled to a generally orthogonal thermal pathway without the generally orthogonal thermal pathway being blocked by or interfering with the MOSFET, each thermal path being substantially electrically isolated from the MOSFET; and (d) at least one generally orthogonal thermal pathway thermally coupled to the second portion of a respective one of the at least one thermal path and configured to convey heat from the respective one of the at least one thermal path to at least one externally accessible thermal pad.

11. The invention of claim 10, wherein at least one thermal path includes at least one dummy gate thermally-coupled to the MOSFET.

* * * * *